(12) United States Patent
Smith et al.

(10) Patent No.: US 11,024,681 B2
(45) Date of Patent: Jun. 1, 2021

(54) PARALLAX OPTICS FOR TOP EMITTING ELECTROLUMINESCENT DISPLAYS

(71) Applicant: Sharp Kabushiki Kaisha, Osaka (JP)

(72) Inventors: Nathan James Smith, Oxford (GB); Hywel Hopkin, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/541,573

(22) Filed: Aug. 15, 2019

(65) Prior Publication Data
US 2021/0050393 A1 Feb. 18, 2021

(51) Int. Cl.
*H01L 27/32* (2006.01)
*H01L 27/15* (2006.01)
*G02F 1/13* (2006.01)
*H01L 51/52* (2006.01)

(52) U.S. Cl.
CPC ........ *H01L 27/3232* (2013.01); *G02F 1/1323* (2013.01); *H01L 27/156* (2013.01); *H01L 27/326* (2013.01); *H01L 27/3211* (2013.01); *H01L 51/5293* (2013.01)

(58) Field of Classification Search
None
See application file for complete search history.

(56) References Cited

U.S. PATENT DOCUMENTS

| | | | |
|---|---|---|---|
| 8,466,454 B2 * | 6/2013 | Park | H01L 27/3213 257/40 |
| 10,663,776 B1 * | 5/2020 | Hopkin | G09G 3/3426 |
| 2012/0075540 A1 * | 3/2012 | Chen | G02F 1/13471 349/15 |
| 2012/0188475 A1 * | 7/2012 | Inoue | H04N 13/315 349/36 |
| 2013/0083392 A1 * | 4/2013 | Jain | G02B 30/24 359/465 |
| 2013/0335648 A1 * | 12/2013 | Kuroda | G02B 30/27 349/15 |
| 2014/0104521 A1 * | 4/2014 | Nishimura | G02F 1/1323 349/33 |
| 2014/0104545 A1 * | 4/2014 | Miyazawa | G02F 1/133528 349/96 |
| 2014/0361990 A1 * | 12/2014 | Leister | G02F 1/133753 345/156 |
| 2016/0011429 A1 * | 1/2016 | Vdovin | H04N 13/349 359/462 |
| 2016/0139457 A1 * | 5/2016 | Wu | G02F 1/133514 349/62 |

(Continued)

*Primary Examiner* — Ryan Crockett
(74) *Attorney, Agent, or Firm* — Renner, Otto, Boisselle & Sklar, LLP

(57) ABSTRACT

A multimode display device is configured for enhanced performance of a non-directional (public) viewing mode and one or more directional (narrow) viewing modes. The display device includes a switchable optical assembly disposed on a viewing side of a top emitting electroluminescent display. The switchable optical assembly includes one of a switchable parallax layer that includes an electro optic material, or a non-switchable parallax layer in combination with a switchable scattering device that includes the electro-optic material and is disposed on the viewing side of the non-switchable parallax layer. The switchable optical assembly is switched so as to re-configure the display device between the non-directional and directional viewing modes.

18 Claims, 18 Drawing Sheets

(56) References Cited

U.S. PATENT DOCUMENTS

| | | | |
|---|---|---|---|
| 2016/0195731 A1* | 7/2016 | Murao | H04N 13/31 |
| | | | 349/15 |
| 2017/0123267 A1* | 5/2017 | Yanai | G02B 5/3025 |
| 2017/0322358 A1* | 11/2017 | Ueki | B32B 27/06 |
| 2020/0257166 A1* | 8/2020 | Smith | G02F 1/1368 |
| 2020/0319513 A1* | 10/2020 | Fattal | G02F 1/1323 |
| 2021/0018773 A1* | 1/2021 | Woodgate | G02F 1/133528 |

* cited by examiner

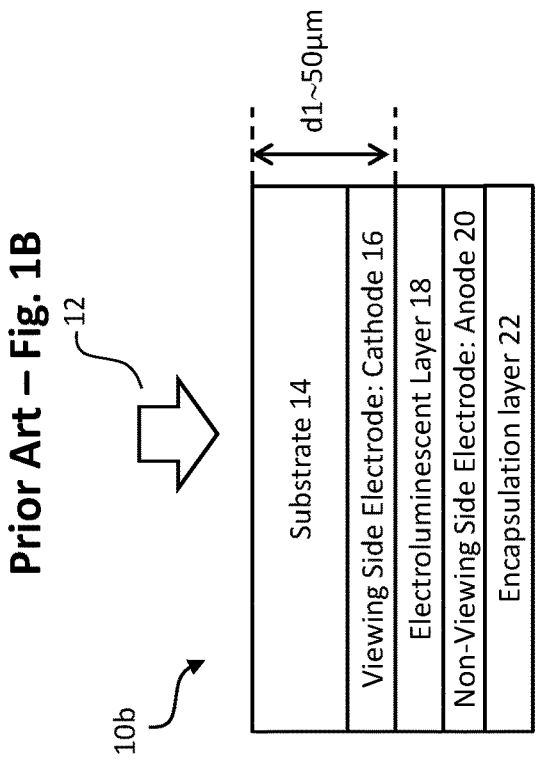
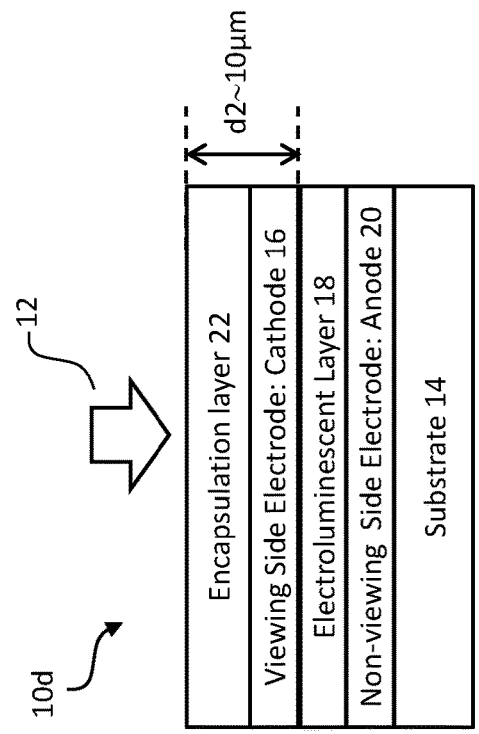
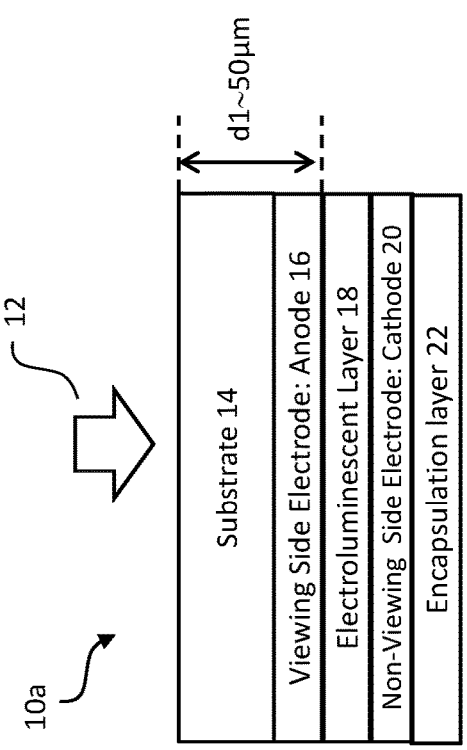
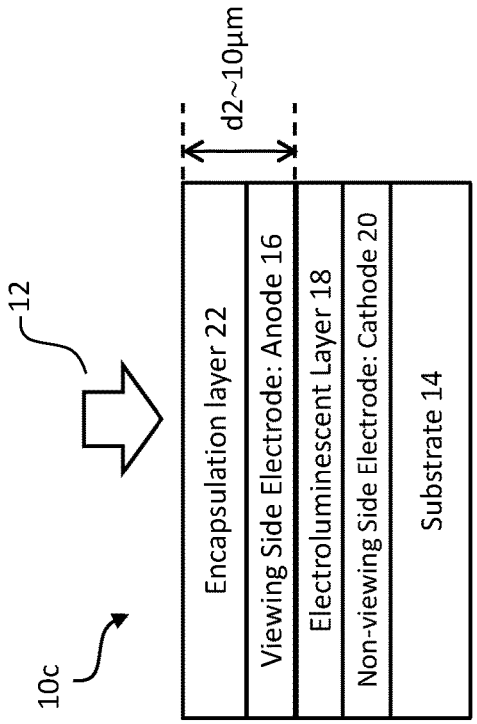

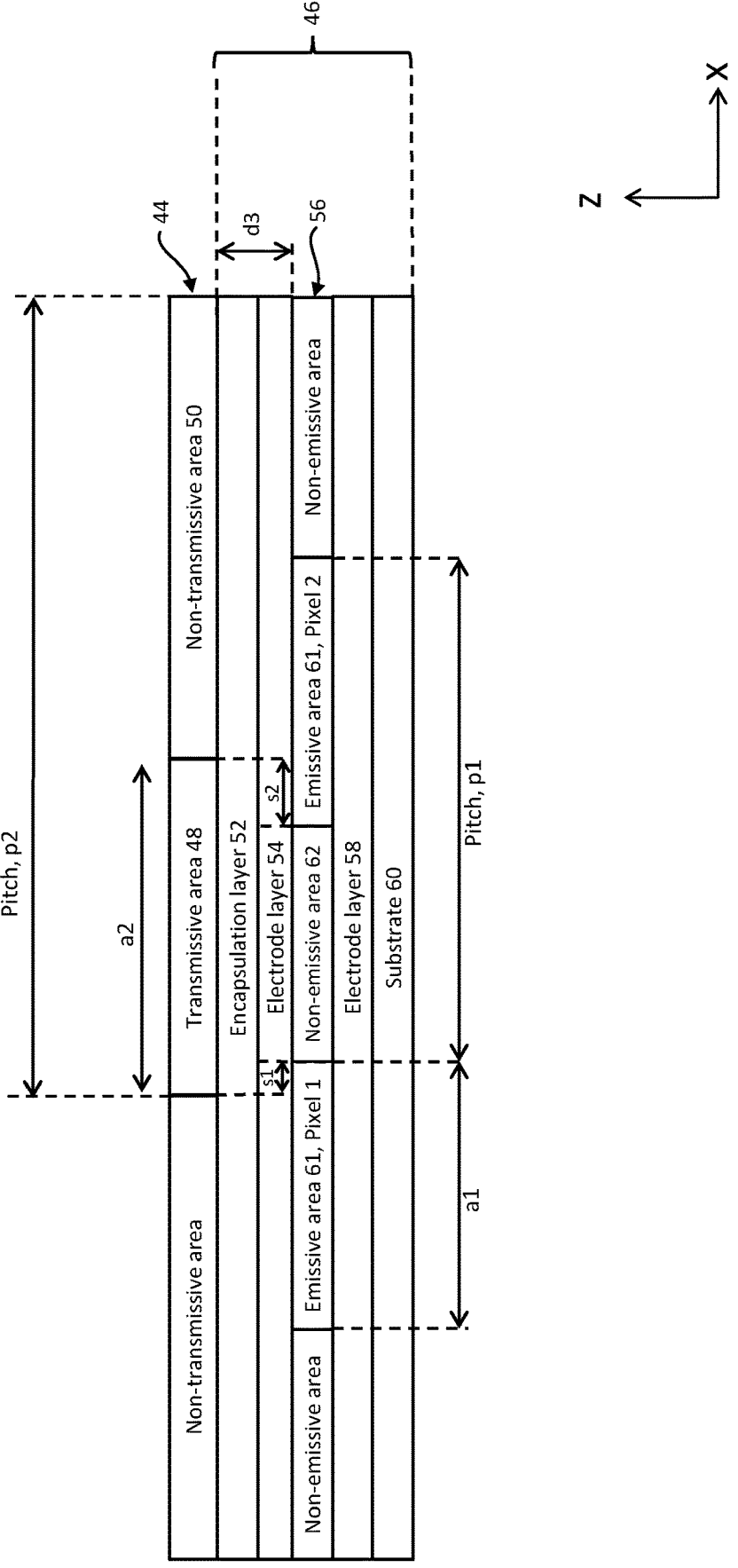

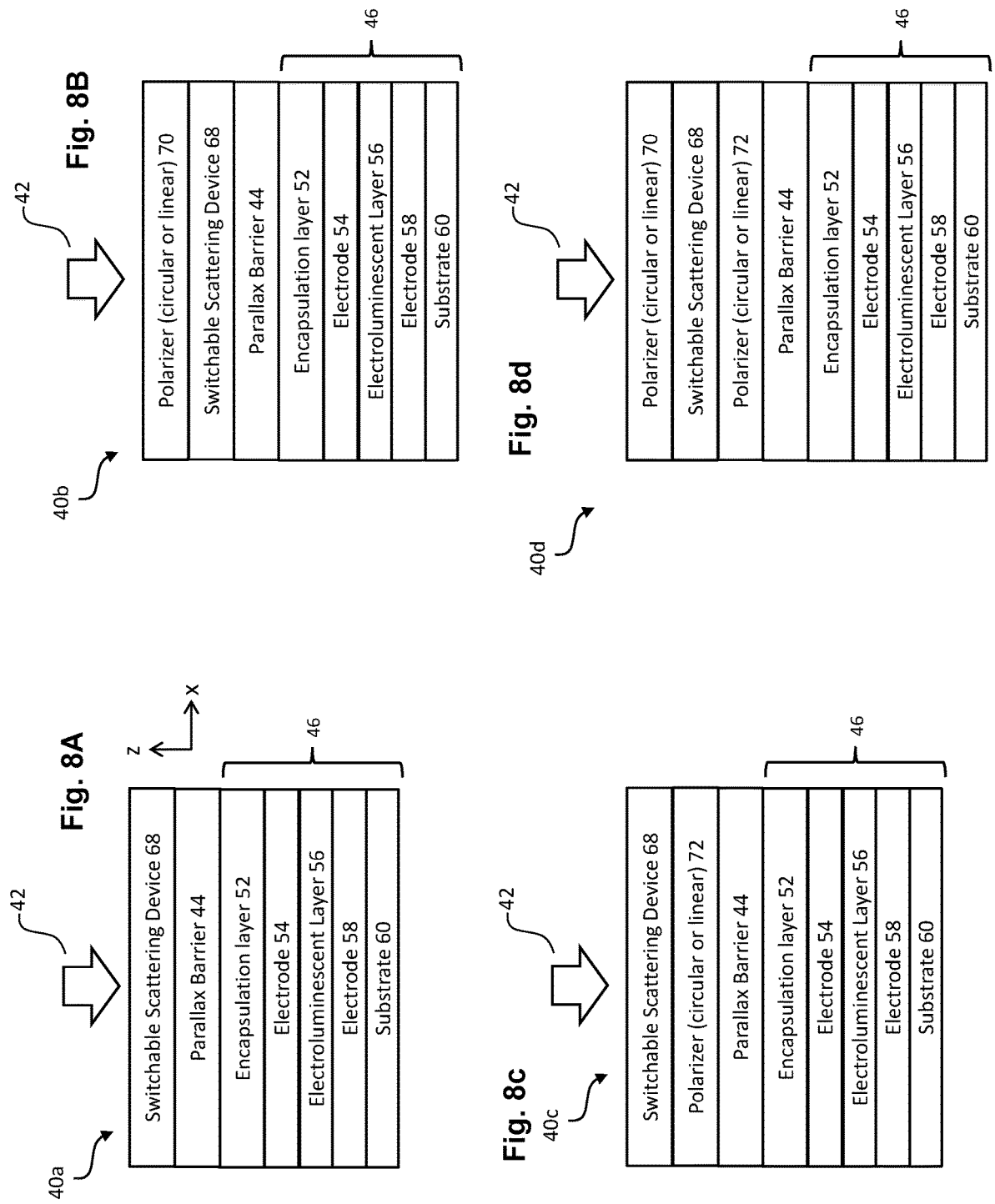

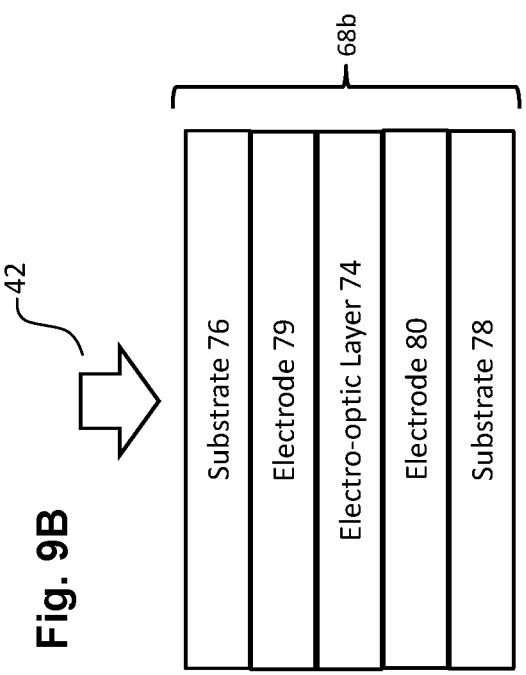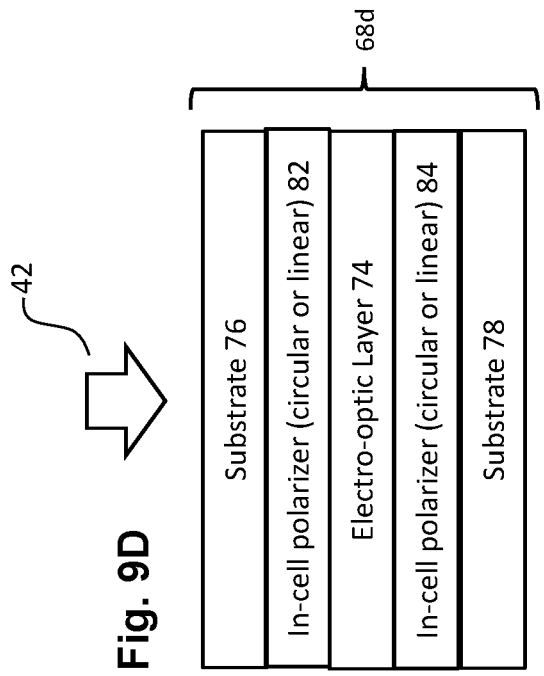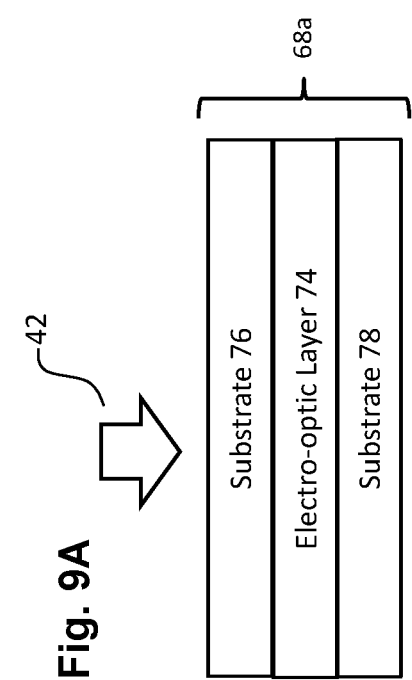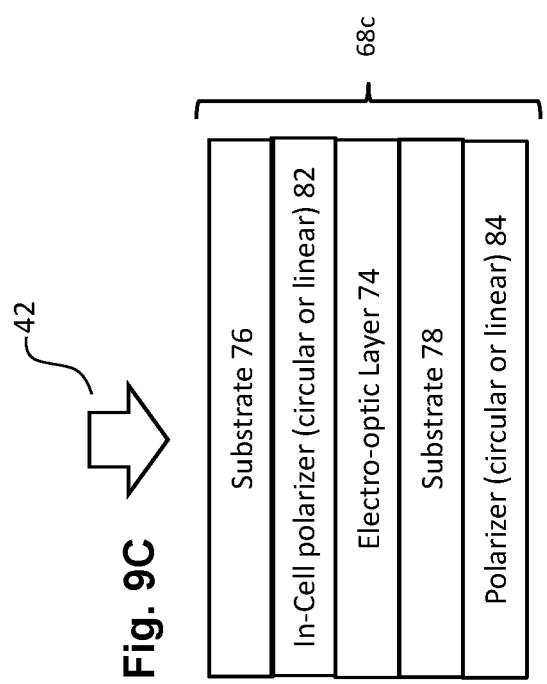

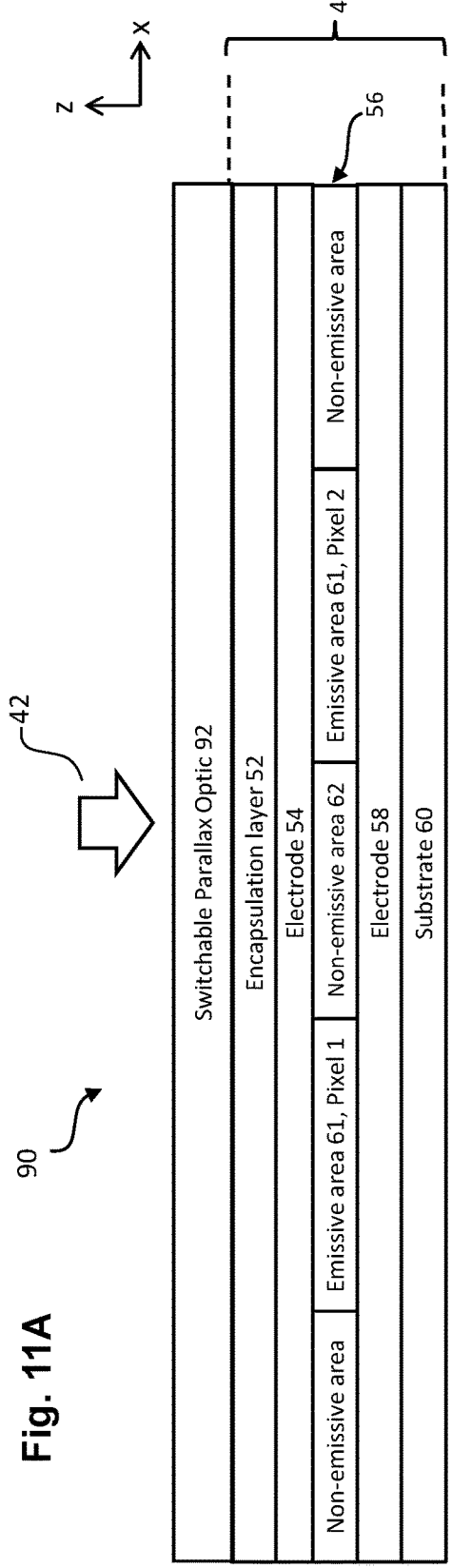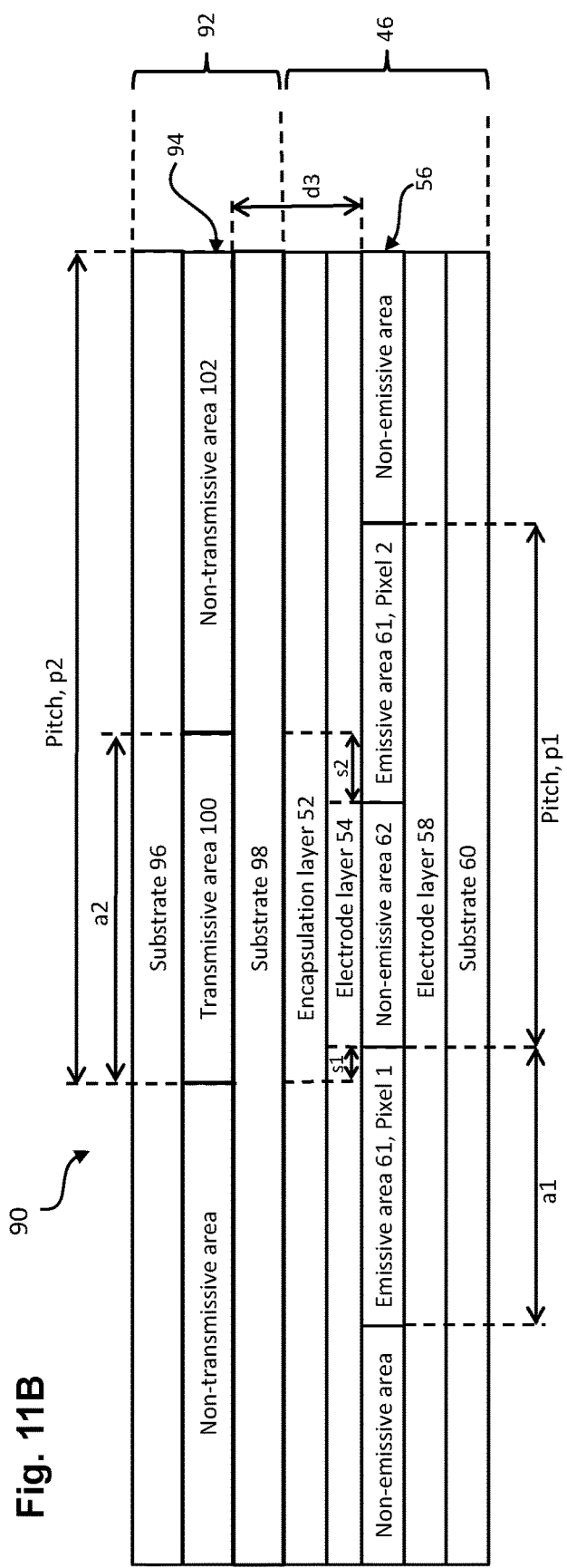
Fig. 11A
Fig. 11B

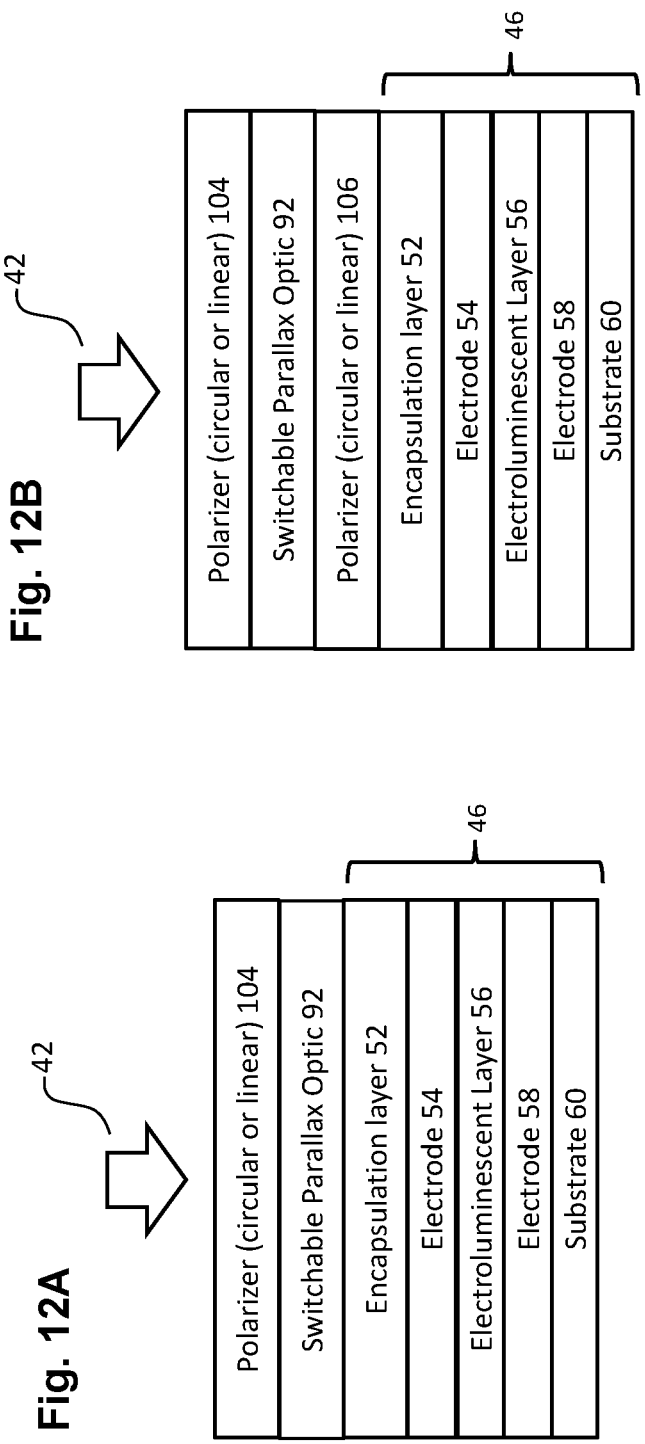

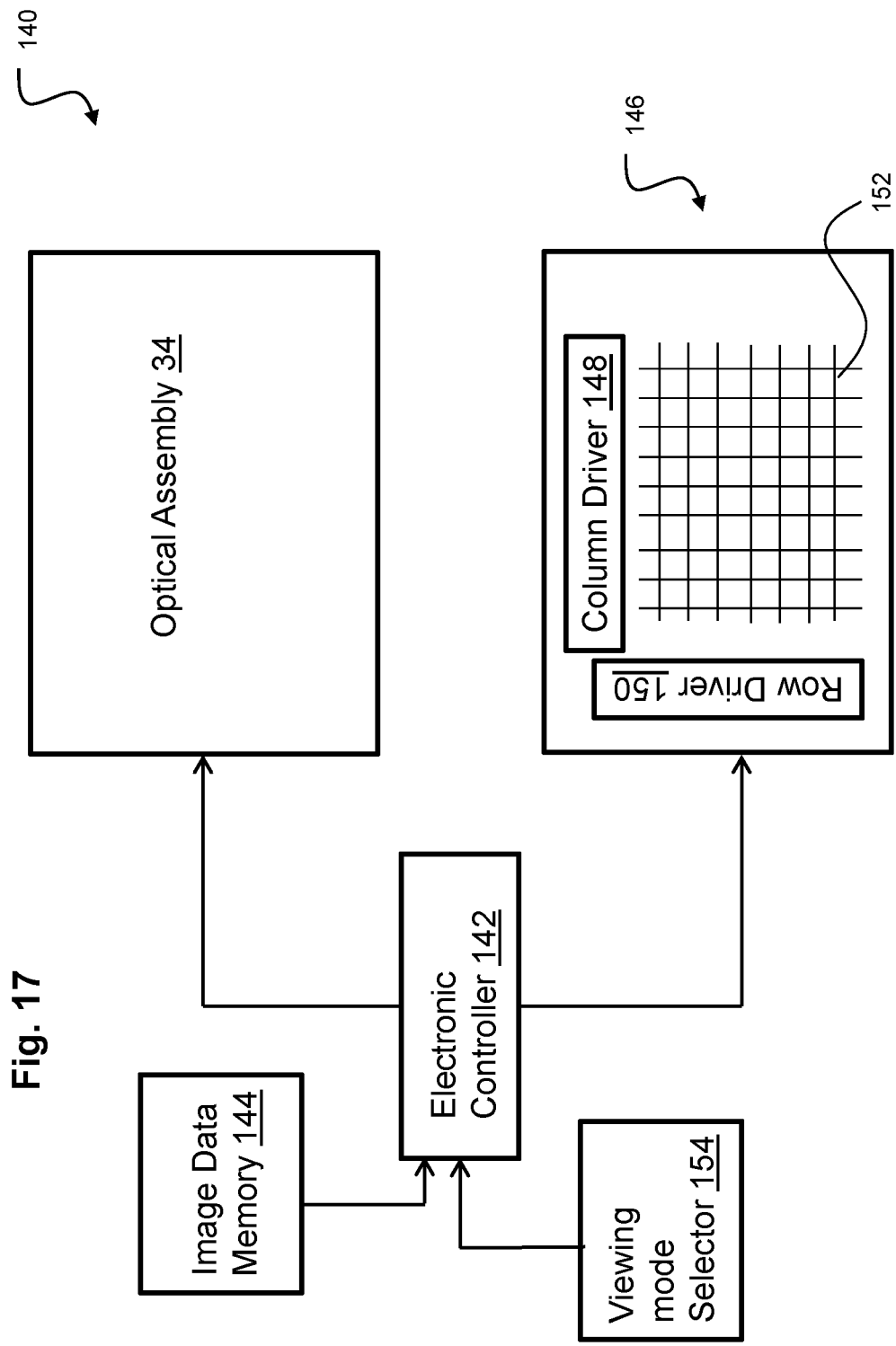

PARALLAX OPTICS FOR TOP EMITTING ELECTROLUMINESCENT DISPLAYS

TECHNICAL FIELD

The present disclosure relates generally to display devices and, more particularly, to top emitting electroluminescent displays such as organic light-emitting diode (OLED), quantum dot LED (QLED), and/or micro LED display devices.

BACKGROUND ART

Multimode displays, in which an image seen by a viewer may be dependent upon viewing angle, are useful in a variety of applications in which it is desirable for viewers located at different viewing angles to see different images. An example is a dual view display in an automobile in which a driver and passenger may desire viewing different images (for example, a driver views a navigation screen while a passenger views entertainment content). Other applications of such multimode displays include privacy display modes in which off-axis viewers cannot see image content that is seen by an on-axis viewer (or sees different image content relative to an on-axis viewer), autostereoscopic 3D displays in which a different image is emitted to each eye, and others.

Many such multimode displays are operable and switchable between at least two modes of operation, including a non-directional viewing or public viewing mode in which all viewers may view the same image, and a directional viewing mode in which the viewed image may differ based on viewing angle. One type of directional viewing mode is a dual view mode in which the viewed image is different at different viewing angles. Another type of directional viewing mode is a single view mode in which a single image is emitted that is visible only within a narrow viewing angle range. Such devices typically include a layered structure in which optical components are deposited on a substrate. In a "top-emitting device", image light is emitted from a viewing side of the device that is opposite from the substrate. In a bottom-emitting device, the substrate is located on the viewing side and image light is emitted through the substrate.

U.S. Pat. No. 8,466,454 (Park et al., issued Jun. 18, 2013) discloses an example of a top emitting OLED display with a "disparity rib barrier" positioned on or within an encapsulation layer of the display to create a disparity between two images. The patent states that the barrier must be positioned within 0.1 µm to 10 µm of the emissive layer. Each rib is positioned directly above the boundary between emissive pixel areas. Such a design cannot enable autostereoscopic, privacy or dual view modes. Even if these modes could be achieved with this design, the display could not be switched to an unrestricted public or wide angle mode.

SUMMARY OF INVENTION

The present invention relates to a top emitting display system having an electroluminescent emissive layer (such as an OLED or QLED emissive layer) in combination with a switchable optical assembly that enables multiple viewing modes. The display system can be switched between a directional viewing mode (e.g., dual view or single view private mode) and a non-directional public mode. Embodiments of the present application include a display system that incorporates a switchable parallax optical assembly deposited on the viewing side of a top emitting electroluminescent display.

Generally, the switchable optical assembly can be broadly categorized as belonging to one of two types. The first type of switchable optical assembly includes a non-switchable parallax layer (for example, a non-switchable parallax barrier) and a switchable scattering diffuser layer. The second type of switchable optical assembly includes a switchable parallax layer. An advantage of the first type of switchable optical assembly over the second type of switchable optical assembly is that it may be easier to manufacture a display device with a switchable viewing angle range using the first type of switchable optical assembly because it is easier to achieve a suitably small value for a distance between the electroluminescent layer and the parallax optic layer, which in turn enables a desirable narrow viewing mode. An advantage of the second type of switchable optical assembly over the first type of switchable parallax optic is that a display device with switchable viewing angle range will be brighter in the wide view mode because the second type of switchable optical assembly is more transmissive in the wide view mode. In particular, the wide view mode of the second type of switchable optical assembly contains smaller non-transmissive areas (or zero non-transmissive areas) as compared to the first type of switchable optical assembly.

An aspect of the invention is a multimode display device that is configured for enhanced performance of a non-directional (public) viewing mode and one or more directional (narrow) viewing modes. In exemplary embodiments, the display device includes a switchable optical assembly disposed on a viewing side of a top emitting electroluminescent display. The switchable optical assembly includes one of a switchable parallax layer that includes an electro optic material, or a non-switchable parallax layer in combination with a switchable scattering device that includes the electro-optic material and is disposed on the viewing side of the non-switchable parallax layer. The switchable optical assembly is switched so as to re-configure the display device between the non-directional and directional viewing modes.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIGS. 1A and 1B are drawings illustrating a conventional bottom emitting electroluminescent display.

FIGS. 2A and 2B are drawings illustrating a conventional top emitting electroluminescent display.

FIG. 7 is a drawing depicting a top emitting electroluminescent display system that has a narrow view mode using a non-switchable parallax barrier, in accordance with embodiments of the present application.

FIGS. 8A, 8B, 8C, and 8D are drawings depicting configurations of the display system of FIG. 7, further including a switchable scattering device that is deposited on a viewing side of the non-switchable parallax barrier.

FIGS. 9A, 9B, 9C, and 9D are drawings depicting exemplary configurations of a switchable scattering device for use in the display system of FIGS. 8A-8D.

FIGS. 11A and 11B are drawings depicting another configuration of a display system in accordance with embodiments of the present application that incorporates a switchable parallax optic that is disposed on the viewing side of the top emitting electroluminescent display.

FIGS. 12A and 12B are drawings depicting exemplary configurations of a display system including a switchable parallax optic in combination with one or more polarizers, in accordance with embodiments of the present application.

FIG. 17 is a drawing depicting a block diagram showing operative portions of an exemplary display system in accordance with embodiments of the present application, which demonstrates image display control.

DESCRIPTION OF EMBODIMENTS

Figure 4:
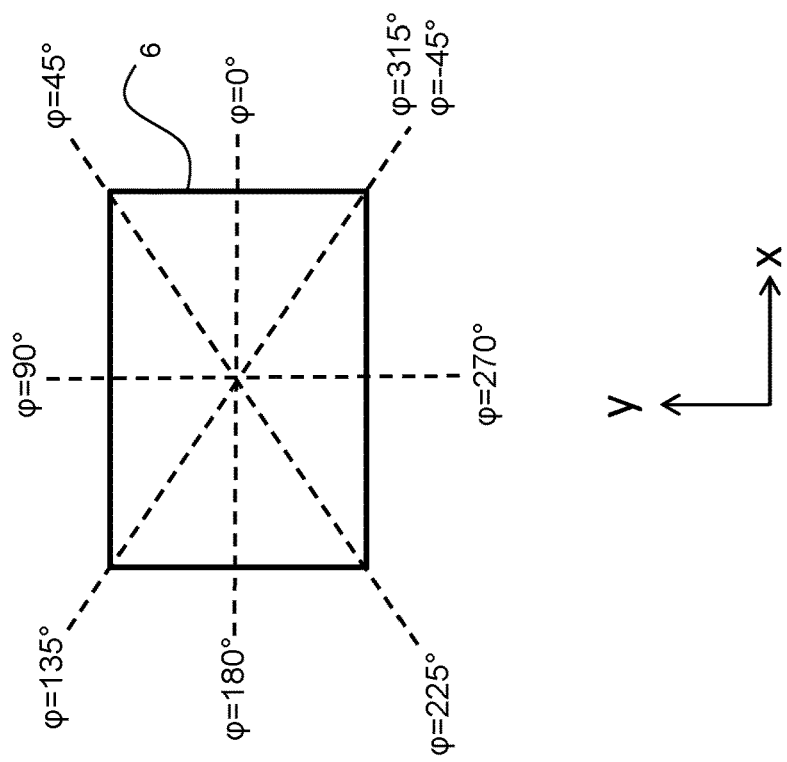
FIG. 4 defines a coordinate system pertaining to the in-plane angle φ identified in FIG. 3.

Embodiments of the present invention will now be described with reference to the drawings, wherein like reference numerals are used to refer to like elements throughout. It will be understood that the figures are not necessarily to scale.

An electroluminescent display contains an electroluminescent layer that emits light when stimulated by an electrical signal. The electrical signal is generally provided by two electrodes, which may include an anode and a cathode. The electroluminescent layer may be an organic light emitting diode (OLED) layer, a quantum dot (QD) layer, a quantum rod (QR) layer, or a light emitting diode (LED) layer, or combination thereof. In general, for an OLED layer, QD layer or QR layer, the electroluminescent display also contains an electron transport layer and a hole transport layer for the transportation of electrons and holes into the emissive layer, where they recombine to emit light. These specific layers are omitted from the figures for simplicity of illustration. An LED layer may contain multiple electroluminescent layers stacked in the viewing direction, but only a single layer is shown in the figures again for simplicity of illustration.

FIGS. 1A and 1B are drawings illustrating a conventional bottom emitting electroluminescent display 10a and 10b. From the viewing side 12 indicated by the arrow, the bottom emitting electroluminescent display 10a/10b includes a substrate 14 (which may be glass or polymer material), a viewing side electrode 16, an electroluminescent layer 18, a non-viewing side electrode 20, and an encapsulation layer 22. The encapsulation layer may be omitted for an LED display. The encapsulation layer may include at least two distinct layers of organic and/or inorganic materials; however, a single encapsulation layer is shown for simplicity. The viewing side electrode 16 may be the anode as shown in FIG. 1A, or the viewing side electrode 16 may be the cathode as shown in FIG. 1B. Commensurately, the non-viewing side electrode 20 may be the cathode as shown in FIG. 1A, or the non-viewing side electrode 20 may be the anode as shown in FIG. 1B. An important dimension for performance of such a display system is the distance d1 from the viewing side uppermost surface of the display to the electroluminescent layer. As indicated in FIGS. 1A and 1B, typically the distance d1 is approximately 50 μm for a bottom emitting electroluminescent display and is measured from the upper surface of the substrate 14 to the electroluminescent layer 18. Typically, the distance d1 for a bottom emitting electroluminescent display is too large to provide a high-performance dual mode display due to the manner of operation of the parallax optics to generate the different modes, as described in more detail below.

Accordingly, embodiments of the current application employ a top emitting configuration. FIGS. 2A and 2B are drawings depicting a conventional top emitting electroluminescent display 10c and 10d. Comparable layers are identified with comparable reference numerals as in FIGS. 1A and 1B for ease of comparison. From the viewing side 12, the top emitting electroluminescent display 10c/10d includes an encapsulation layer 22, a viewing side electrode 16, an electroluminescent layer 18, a non-viewing side electrode 20, and a substrate 14 (which again may be glass or polymer material). The viewing side electrode 16 may be the anode as shown in FIG. 2A, or the viewing side electrode 16 may be the cathode as shown in FIG. 2B. Commensurately, the non-viewing side electrode 20 may be the cathode as shown in FIG. 2A, or the non-viewing side electrode 20 may be the anode as shown in FIG. 2B. Similarly as for the bottom emitting device, an important dimension for performance of the top emitting device is the distance d2 from the viewing side uppermost surface of the display to the electroluminescent layer. As indicated in FIGS. 2A and 2B, typically the distance d2 is approximately 10 µm for a top emitting electroluminescent display and is measured from the upper surface of the encapsulation layer 22 to the electroluminescent layer 18. Typically, the distance d2 for a top emitting electroluminescent display is suitable to provide a high-performance dual mode display with the operation of the parallax optics to generate the different modes, as described in more detail below.

Figure 3:
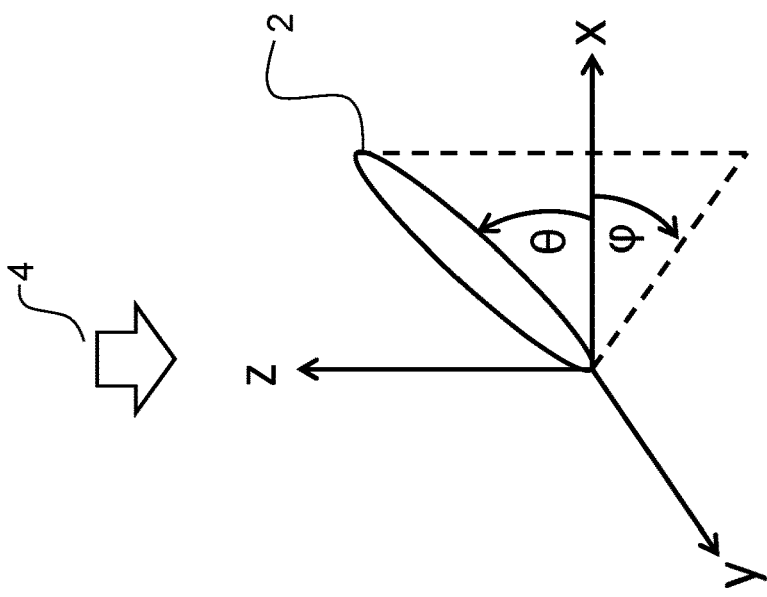
FIG. 3 defines a coordinate system for illustrating pertinent terms of orientation used in this disclosure.

For illustrative purposes, FIG. 3 defines a coordinate system for illustrating pertinent terms of orientation used in this disclosure. The axes x, y and z are orthogonal to each other. The angle between the x-axis and the y-axis is defined as the in-plane angle $\varphi$, with the term in-plane more particularly referring to being parallel to the plane of an LCD device. The angle between the x-axis (or y-axis) and the z-axis is the out-of-plane angle $\theta$ relative to the plane of a display device. For reference, an illustrative rod shaped object 2 is depicted as may be oriented within a layer, and a viewing direction 4 of a viewer along the z-axis is also shown. The rod shaped object 2 may be characterized by a long axis and a short axis. FIG. 4 defines a related coordinate system pertaining to the in-plane angle $\varphi$ identified in FIG. 3. In particular, FIG. 4 shows a range of positioning of the in-plane angle $\varphi$ with respect to a display device from the perspective of a viewing position relative to a generalized display device 6.

Figure 5B:
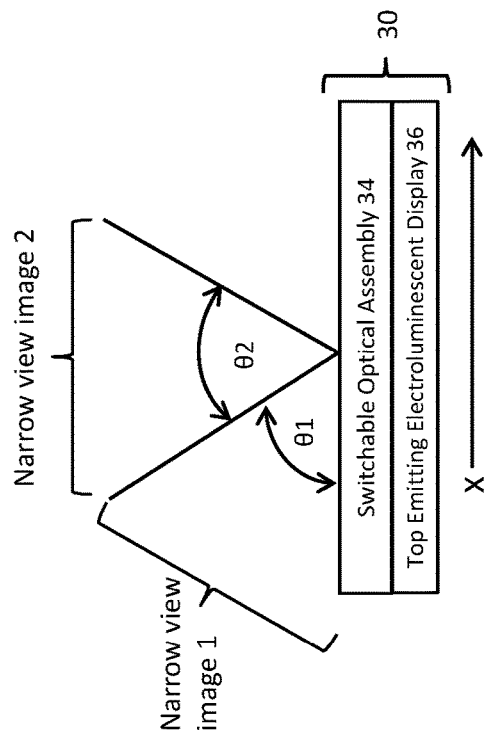
FIGS. 5A, 5B, and 5C are drawings depicting a generalized display system in accordance with embodiments of the present application, to illustrate different viewing modes that can be achieved by the various embodiments.
Figure 5A:
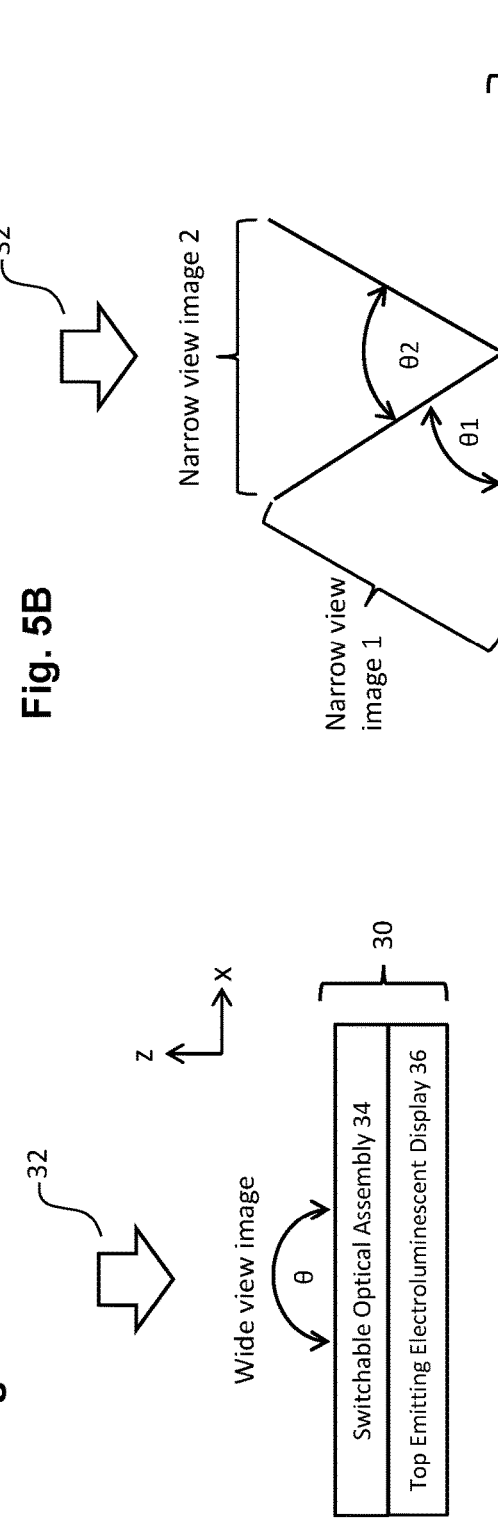
Figure 5C:
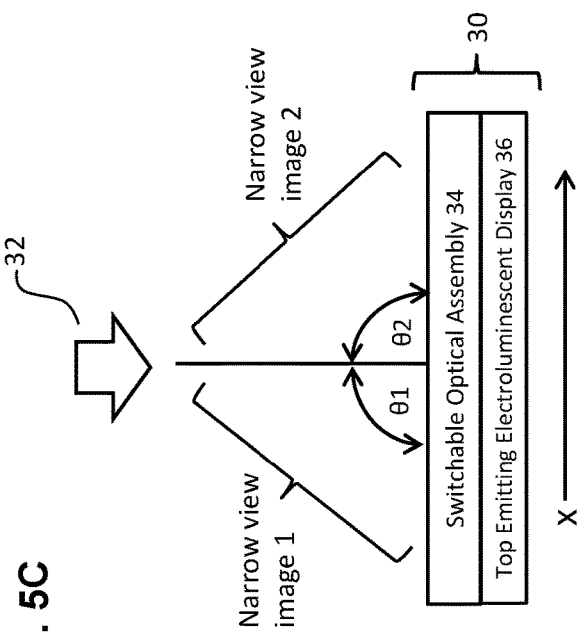

FIGS. 5A-5C are drawings depicting a generalized display system 30 in accordance with embodiments of the present application, to illustrate different viewing modes that can be achieved by the various embodiments described below. The display device 30 has a switchable viewing angle range, and the viewing side 32 is denoted by the arrow. The display 30 includes from the viewing side a switchable optical assembly 34 that is switched to generate the different viewing angle modes, and a top emitting electroluminescent display 36. The optical assembly 34 preferably is in optical contact with to the top emitting electroluminescent display 36 to prevent unwanted reflections. Optical contact may be achieved via an adhesive layer (not shown for simplicity) deposited between the top emitting electroluminescent display 36 and the optical assembly 34. Details of various embodiments of the optical assembly 34 are described below in connection with various configurations of multimode display systems in accordance with embodiments of the present application.

FIG. 5A illustrates a first mode of operation, also referred to as a non-directional or public viewing mode, whereby the optical assembly 34 is configured to enable a single image (wide view image) emitted from the top emitting electroluminescent display 36 to be viewed from all suitable viewing angles. Such mode, therefore, also is referred to as a wide view mode. FIG. 5B illustrates a second mode of operation, also referred to as a directional dual view mode, whereby the optical assembly 34 is configured to enable a first image (narrow view image 1) emitted from the top emitting electroluminescent display 36 to be viewed in a first narrow view angle range $\theta 1$, and a second image (narrow view image 2) emitted from the top emitting electroluminescent display to be viewed in a second narrow view angle range $\theta 2$, whereby the first narrow view angle range $\theta 1$ is different from the second narrow view angle range $\theta 2$. Such mode, therefore, also may be referred to as the narrow view mode. FIG. 5C is an alternative narrow view mode in which different viewing angle ranges are achieved as compared to that of FIG. 5B. Switching between the wide view mode and the narrow view mode is achieved by switching the optical assembly 34 between different modes of operation, as further detailed below.

As shown in FIGS. 5B and 5C, the first viewing angle range $\theta 1$ and the second viewing angle range $\theta 2$ may vary as a function of x, the lateral distance across the display. Varying the viewing angle range $\theta 1$ and $\theta 2$ as a function of x may be achieved by varying the pitch and/or the lateral offset (x-position) of parallax components within the optical assembly 34 relative to the pixels of the top emitting electroluminescent display. The pitch or pitches of the parallax components within the optical assembly 34 is predetermined to enable the desired angle viewing range $\theta 1$ of narrow view mode 1 and the desired angle viewing range $\theta 2$ of narrow view mode 2 as may be desired for any particular application.

The specific configurations of embodiments of the optical assembly 34 are described in further detail below. Generally, the optical assembly 34 includes at least a first parallax optical component. A distance, d2, referenced above between the electroluminescent layer of the top emitting electroluminescent display 36 and a parallax optical component of the optical assembly 34, is predetermined to enable switching between the wide view mode and the desired narrow view mode. The distance d2 has a significant influence on the angle range for narrow view image 1 and narrow view image 2. A relatively small value d2 obtained by using a top emitting electroluminescent display enables desirable angle ranges for narrow view image 1 and narrow view image 2 that are appropriate for embodiments of present application. As referenced above, by comparison the relatively large value d1 obtained by using a bottom emitting electroluminescent display is not suitable to achieve comparable viewing angles.

A first type of the optical assembly 34 may include a non-switchable parallax optic in combination with a switchable scattering device. The non-switchable parallax optic may include a parallax barrier that may include transmissive regions and non-transmissive regions that are interlaced with each other. The non-transmissive regions may be parallax elements that absorb light and/or reflect light. Parallax elements that reflect light may be used to enhance the brightness of the top emitting electroluminescent display. The non-switchable parallax optic may include a one-dimensional cylindrical lens array (lenticular lens array) or a two-dimensional lens array. The lens array may have non-transmissive regions that act as parallax barriers disposed between the individual lens elements. The switchable scattering device may include an electro-optic material, such as a liquid crystal layer that is sandwiched between an arrangement of electrodes and substrates. The switchable scattering device is on the viewing side of the non-switchable parallax optic.

The non-switchable parallax optic is configured so that in the narrow view mode, a first set of pixels of the top emitting electroluminescent display can be viewed in the first narrow view angle range and a second set of pixels of the top emitting electroluminescent display can be viewed in the second narrow view angle range. In the wide view mode, the switchable scattering device is configured to diffuse or scatter light that is transmitted from the non-switchable parallax optic towards the viewer. Consequently, all pixels of the top emitting electroluminescent display can be viewed from all angles, and thus the wide view image has 100% resolution. The resolution of the wide view image is higher than either of the resolution of the narrow view image 1 or the narrow view image 2. In the narrow view mode, the switchable scattering device is configured not to diffuse (i.e. not scatter) light that is transmitted from the non-switchable parallax optic towards the viewer. Consequently, a first set of pixels of the top emitting electroluminescent display can be viewed in the first narrow view angle range, and a second set of pixels of the top emitting electroluminescent display can be viewed in the second narrow view angle range. The resolution of the narrow view image 1 may be the same as or different from the resolution of the narrow view image 2.

Alternatively, a second type of the optical assembly 34 may include a single component constituting a switchable parallax optic. The switchable parallax optic may include a switchable parallax barrier with similar transmissive regions and non-transmissive regions as described above. For example, the switchable parallax optic may include an arrangement of lenses or lenses and parallax barrier elements disposed between the lenses. The switchable parallax optic further may include an electro-optic material, such as a liquid crystal layer or electro-deposition material that is sandwiched between an arrangement of electrodes and substrates. The switchable parallax optic is switchable between a narrow view angle mode and the wide view angle mode.

An advantage of the first type of switchable optical assembly over the second type of switchable optical assembly is that it may be easier to manufacture a display device with a switchable viewing angle range using the first type of switchable optical assembly because it is easier to achieve a suitably small value for a distance d2 between the electroluminescent layer and the parallax optic layer, which in turn enables a desirable narrow viewing mode. An advantage of the second type of switchable optical assembly over the first type of switchable parallax optic is that a display device with switchable viewing angle range will be brighter in the wide view mode because the second type of switchable optical assembly is more transmissive in the wide view mode. In particular, the wide view mode of the second type of switchable optical assembly contains smaller non-transmissive areas (or zero non-transmissive areas) as compared to the first type of switchable optical assembly.

Figure 6B:
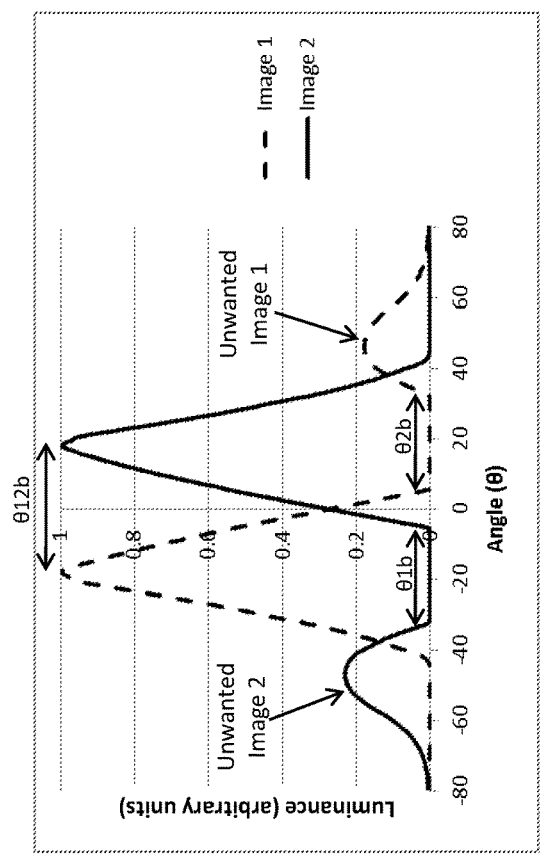
FIG. 6B is a drawing depicting the simulated angular dependent luminance profiles of a display system including a bottom emitting electroluminescent display and optical assembly for a narrow viewing mode.
Figure 6A:
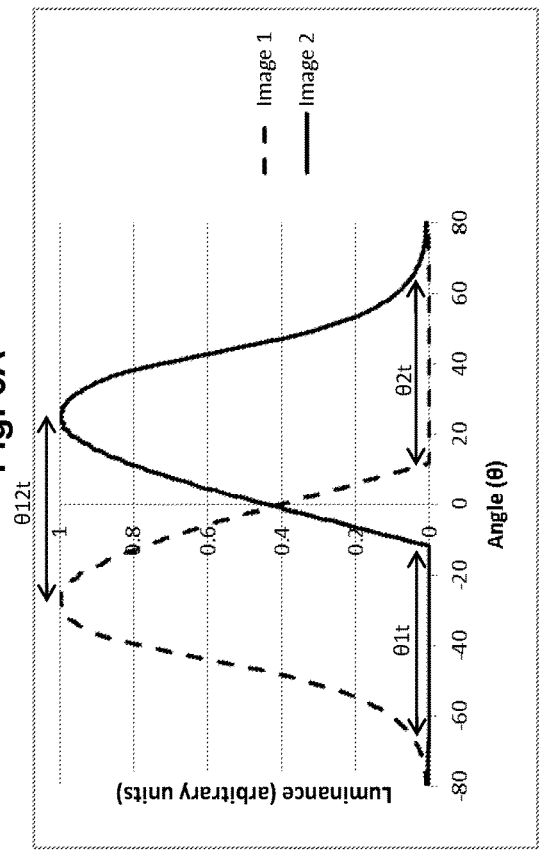
FIG. 6A is a drawing depicting the simulated angular dependent luminance profiles of a display system including a top emitting electroluminescent display and optical assembly for a narrow viewing mode.

FIG. 6A is a drawing depicting the simulated angular dependent luminance profiles of a display system including a top emitting electroluminescent display 36 and optical assembly 34 for a narrow viewing mode. The optical assembly used in this simulation includes a parallax barrier. FIG. 6A shows a first narrow angle viewing range $\theta 1t$ ~50° for a first image (image 1) and a second narrow angle viewing range $\theta 2t$ ~50° for a second image (image 2). A viewing angle range in this context may also be known as a viewing window. FIG. 6A shows a relatively large angular separation $\theta 12t$ ~60° between the first and second images (i.e. a relatively large separation between the first and second viewing windows). FIG. 6A shows that in the narrow viewing mode, a first person can observe the first images in the first narrow viewing angle range while positioned within $\theta 1t$, and a second person can observe the second images in the second narrow viewing angle range while positioned within $\theta 2t$.

For comparison, FIG. 6B is a drawing depicting the simulated angular dependent luminance profiles of a display system including a bottom emitting electroluminescent display and comparable optical assembly for a narrow viewing mode. The pixel sizes and pixel layout of the bottom emitting electroluminescent display and the top emitting electroluminescent display are identical for both simulations of FIGS. 6A and 6B. The assembly used in the simulation of FIG. 6B includes a parallax barrier that is identical to parallax barrier used in the FIG. 6A simulation. FIG. 6B shows a first narrow angle viewing range $\theta 1b$ ~25° for a first image (image 1) and a second narrow angle viewing range $\theta 2b$ ~25° for a second image (image 2). FIG. 6B shows a relatively small angular separation $\theta 12b$ ~40° between the first and second images.

By comparing FIG. 6A and FIG. 6B, $\theta 1t$ is significantly larger than $\theta 1b$, $\theta 2t$ is significantly larger than $\theta 2b$, and $\theta 12t$ is significantly larger than $\theta 12b$. Therefore, the narrow view mode of the top emitting electroluminescent display is considerably superior to the narrow view mode of the bottom emitting electroluminescent display. A further undesirable feature of the bottom emitting electroluminescent display in the narrow view mode is the presence of a further angle range that has unwanted image 1, and a further angle range that has unwanted image 2. Unwanted image 1 reduces the viewing angle range from $\theta 2t$ to $\theta 2b$, and unwanted image 2 reduces the viewing angle range from $\theta 1t$ to $\theta 1b$. The reason the bottom emitting electroluminescent display has significantly smaller viewing angle ranges for image 1 and image 2 relative to the top emitting electroluminescent display is because d1 for the bottom emitting electroluminescent display is significantly larger than d2 for the top emitting electroluminescent display (see again FIGS. 1A, 1B, 2A and 2B).

FIG. 7 is a drawing depicting a top emitting electroluminescent display system 40 that has a narrow view mode, whereby a first narrow angle viewing range exists for a first image (image 1) and a second narrow angle viewing range, different from the first, exists for a second image (image 2). The viewing side direction 42 is denoted by the arrow. The display system 40 includes from the viewing side a parallax barrier 44 and a top emitting electroluminescent display 46. In this embodiment, the parallax barrier 44 is non-switchable, and includes non-transmissive areas 48 interlaced with transmissive areas 50. The top emitting electroluminescent display 46 may be configured comparably as illustrated in FIGS. 2A and 2B, and thus may include from the viewing side: an encapsulation layer 52, a viewing side electrode 54, an electroluminescent layer 56, a non-viewing side electrode 58, and a substrate 60. In exemplary embodiments, the electroluminescent layer 56 may include an array of pixels having emissive areas 61 interlaced with non-emissive areas 62. As used herein, the term "pixel" may also include sub-pixels that may be individual light-emitting regions of a broader pixel with multiple sub-pixels, such as for example a multi-color pixel (e.g., with red/green/blue sub-pixels). Accordingly, principals of the current application apply equally to pixels and sub-pixels, and thus such terms are interchangeable for purposes of the current application.

A first image may be addressed to a first set of pixels (denoted Pixel 1), such as the pixels pertaining to each odd numbered column, and the second image may be addressed to a second set of pixels (denoted Pixel 2), such as the pixels pertaining to each even numbered column. In other words, the first and second images may be interlaced in the vertical (y) direction of the display 46. The top emitting electroluminescent display system 40 enables the luminance profiles shown in FIG. 6A. Consequently, the resolution of the first image in the first narrow angle viewing range is 50% of the native resolution of the electroluminescent display 46, and the resolution of the second image in the second narrow angle viewing range also is 50%. In other words, the narrow view mode in this example is a dual view mode whereby two independent images may be observed from different viewing directions, wherein a first viewing direction includes a first viewing angle range and a second viewing direction includes a second viewing angle range different from the first viewing angle range.

As referenced above, the top emitting electroluminescent display 46 has an electroluminescent layer 56 that includes an array of pixels that includes emissive areas 61 interlaced with non-emissive areas 62. In particular, each pixel has an emissive area 61 of aperture width a1 and a pixel pitch of p1 that includes an emissive area 61 and an adjacent non-emissive area 62. It will be appreciated that pixels of different colors may have different aperture widths of the emissive areas 61. The parallax barrier 44 in this embodiment is a non-switchable parallax barrier that includes transmissive areas 48 interlaced with non-transmissive areas 50. Parallax elements of the parallax barrier 44 include a transmissive area 48 having an aperture width a2, and a pitch p2 that further includes an adjacent non-transmissive area 50. In embodiments that implement a dual view display of two images, the parallax barrier pitch p2 may be approximately twice, and approximately in a range of 1.8 to 2.2 times, as large as the pixel pitch p1. The parallax barrier aperture may be arranged in the vertical (y) direction of the display. Alternatively, the parallax barrier aperture may be arranged in a slanted direction with respect to the edges of the display.

FIG. 7 shows two emissive pixels areas 61 (Pixel 1 and Pixel 2) that overlap a common transmissive area 48 of the parallax barrier in the x-direction. As denoted in FIG. 7, a distance between a first edge (left edge in the figure) of the non-emissive area 62 between Pixel 1 and Pixel 2 and the first edge (left edge) of the nearest transmissive area 48 is denoted s1. The distance between a second edge (right edge) of the non-emissive area 62 between Pixel 1 and Pixel 2 and a second edge (right edge) of the transmissive area 48 is s2. FIG. 7 depicts transmission area 48 wider than non-emissive area 62, but it should be appreciated that transmission area 48 and non-emissive area 62 may be the same width, or transmission area 48 may be narrower than non-emissive area 62. In general and for all subsequent embodiments, the emissive area 61 (126 in later figures) may be the same width, narrower or wider than the non-emissive area 62 (128 in later figures) pertaining to the emissive display. In this manner, pixels for the different images share a common transmissive area of the parallax barrier. If s1=s2, then the narrow view mode will be substantially symmetrical about the on-axis position as shown in FIG. 6A. If s1≠s2, then the narrow view mode will be asymmetrical about the on-axis position.

In general, s1 and s2 may vary as a function of lateral position x across the display device 30 to enable, for example, view point correction. View point correction enables different pixels from the display device 30 to be directed to the same point in space. View point correction may be used, for example, so that pixels from both the left hand side and right hand side of the display device 30 are both directed towards the viewer. Consequently, view point correction is used in conjunction with other display device design parameters (such as pitches P1 and P2, distance d3, apertures a1 and a2) to enable a desired image to be directed to a desired spatial region. In general, the value of s1 and s2 govern the offset of the parallax barrier features (such as the transmissive aperture of a parallax barrier or lens center) with respect to pixel layer features (such as the non-emissive area 62, 128 or emissive area 61, 126) of the electroluminescent display.

The width a1 of the emissive areas may vary between red, green, and blue pixels, and in such case, the width of the transmissive areas of the parallax barrier also may vary accordingly for red, green, and/or blue pixels. An advantage of a large width a2 is that a large a2 enables a brighter image because the transmissive areas are larger. An advantage of a small width a2 is that a small a2 enables better angular control of the viewing windows (i.e. better control over the angular direction in which an image is observable). Consequently, the width of a2 may be optimized to enable an acceptable trade-off between brightness and precision of viewing angle ranges for the first and second images.

The non-switchable parallax optic 44 configured as a parallax barrier with transmissive areas and non-transmissive areas is deposited on the viewing side of the top emitting electroluminescent display 46 as shown in FIG. 7. The distance between the electroluminescent layer 56 of the top emitting electroluminescent display and the non-switchable parallax barrier layer 44 is denoted d3. In general, d3 is the distance between the electroluminescent layer and the parallax optic layer wherein the parallax optic layer may be a parallax barrier, a lens array or combination thereof. The thicknesses of the electroluminescent layer and parallax barrier layer are small compared with d3, and therefore the illustration of d3 in FIG. 7 does not include the thicknesses of the electroluminescent layer and parallax barrier layer. The non-switchable parallax optic 44 specifically may be deposited directly on top of the encapsulation layer 52. Alternatively, the non-switchable parallax optic may be deposited on a separate substrate (not shown), and the substrate/parallax optic combination may be adhered to the viewing side of the encapsulation layer. The substrate/parallax optic combination may be adhered with the substrate on the viewing side or the parallax optic on the viewing side. The thickness of any adhesive layer(s) for bonding components together may be minimized. The thickness of the adhesive layer and/or parallax optic substrate may be chosen to optimize the distance d3 to optimize the viewing angles in the narrow view mode.

The construction shown in FIG. 7 is used to generate the optical simulation shown in FIG. 6A, whereby d2=d3. For the various embodiments, the distance d3 generally is the distance between the electroluminescent layer of the top emitting electroluminescent display and the parallax barrier layer. For subsequent embodiments, the parallax barrier layer may be switchable or non-switchable. In some embodiments, d2=d3 while in other embodiments d3>d2. In some embodiments, d3=d2+dn, where do is the additional thickness of layers disposed between the electroluminescent layer and the parallax barrier layer, such as a another substrate or adhesive layer. In accordance with the various embodiments, the value of d3 is sufficiently small so that desirable angular dependent luminance profiles (for example, FIG. 6A and FIG. 15A) are achieved. If the value d3 is too large, undesirable angular dependent luminance profiles (for example, FIG. 6B and FIG. 15B) are achieved. Obtaining a sufficiently small value for d3 is significantly easier with a top emitting electroluminescent display as compared to a bottom emitting electroluminescent display because d2 is significantly smaller than d1 (see FIGS. 1A-2B).

Although the electrode layers 54 and 58 are shown in FIG. 7 without patterning, it will be appreciated to one skilled in the art of displays that at least one of these electrode layers is patterned in a conventional manner so that each pixel (or sub-pixel) of the top emitting electroluminescent display may be driven independently. Materials located between the viewing side of the emissive pixel area and the transmissive area (aperture) of the parallax barrier may each have a different refractive index. For example, the encapsulation layer may include multiple different layers, each with a specific refractive index $n_1$, $n_2$, $n_3$ to $n_i$ (where i is a positive integer). In general, multiple layers are located between the emissive pixel layer of the top emitting electroluminescent display and the aperture of the parallax barrier.

In general, various parameter ranges may be employed within which acceptable angular dependent viewing windows for a dual view mode (as shown in FIG. 6A) can be achieved for a top-emitting electroluminescent display. In general, $0.1 < (d3/p1) < 2.5$, and preferably $0.8 < (d3/p1) < 1.7$, where d3 is the distance between the emissive pixel layer and the parallax barrier layer and p1 is the pitch of the pixels as shown in FIG. 7. In general, $0.2 < (a2/p1) < 1.5$, and preferably $0.4 < (a2/p1) < 1$, where a2 is the width of the parallax barrier aperture. In general, $0.3 < (a1+a2)/p1) < 1.9$, and preferably $0.6 < (a1+a2)/p1) < 1.2$, where a1 is the width of the emissive pixel aperture. The ranges disclosed above may be used singularly or in any combination to realize acceptable angular dependent viewing windows for a dual view mode. These ranges are based upon an image panel design wherein the same color sub-pixels are arranged in the x-direction (horizontal direction with respect to the display), and different colored sub-pixels, such as red, green, and blue are cyclically arranged in the y-direction (vertical direction with respect to the display). These ranges also may be applied to alternative pixel arrangements, such as for example pentile arrangements or other displays with more than three different colored pixel types.

The display system 40 of FIG. 7 is effective at generating a desirable narrow view mode. To add further functionality of a wide view mode to the display system 40, a switchable scattering device or diffuser may be deposited on a viewing side of the non-switchable parallax barrier. Accordingly, FIGS. 8A-8D are drawings depicting configurations of the display system 40 of FIG. 7 (denoted display systems 40a-40d), further including a switchable scattering device 68 that is deposited on a viewing side of the parallax barrier 44. In general, in these embodiments the combination of the non-switchable parallax barrier 44 and the switchable scattering device 68 and polarizer(s) 70, 72 (if applicable) corresponds to the optical assembly 34 generally indicated in FIGS. 5A-5C. For simplicity of illustration, the layer details as shown in FIG. 7 are omitted from the depictions in FIGS. 8A-8D.

The switchable scattering device 68 has a first mode of operation that does not scatter or diffuse light, which thus enables the display systems 40a-40d to operate in the narrow view mode so that the first image is visible in the first viewing angle range and the second image (which may be different from the first image) is visible in the second viewing angle range. The switchable scattering device 68 has a second mode of operation that scatters or diffuses light, which thus enables the display systems 40a-40d to operate in the wide view mode so that a single image is viewed from all viewing angles. The resolution of the image in the wide angle viewing mode is 100% of the native resolution of the electroluminescent display 46. The switchable scattering device 68 may be polarization dependent so that light of a first polarization state is scattered, and light of a second polarization state different from the first polarization state is not scattered. The switchable scattering device 68 may be polarization independent such that the scattering versus non-scattering states are not dependent upon the polarization state of incident light.

FIGS. 8B-8D show various combinations of polarizers, which may be linear or circular polarizers, that may be employed in combination with the switchable scattering device 68 to enhance performance as warranted for a given application. In particular, in the embodiment of FIG. 8B, a viewing side polarizer 70 is deposited on the switchable scattering device 68. In the embodiment of FIG. 8C, the switchable scattering device 68 is deposited on a non-viewing side polarizer 72. The embodiment of FIG. 8D includes both viewing side and non-viewing side polarizers 70 and 72 with the switchable scattering device 68 deposited between the two polarizers.

As referenced above, the combination of the switchable scattering device 68 (with or without the additional polarizers) and the non-switchable parallax barrier 44 overall constitutes a switchable optical assembly corresponding to the optical assembly 34 of FIGS. 5A-5C. An advantage of the circular polarizer embodiments is that the circular polarizer may reduce ambient reflections from the switchable scattering device, the parallax barrier, and/or the top emitting electroluminescent display. Reducing ambient reflections is important to improve image quality (such as contrast ratio and color gamut) when ambient lighting (such as office lighting or sunshine) is high. As is known in the art, the circular polarizer is a combination of a linear polarizer and at least one further layer that functions as a quarter wave retarder ($\lambda/4$). The quarter wave retarder ($\lambda/4$) may be formed as a single layer, or the quarter wave retarder ($\lambda/4$) function may be achieved using multiple layers of retarders. The optical axis of the quarter wave retarder ($\lambda/4$) is orientated at ±45° to the transmission axis of the linear polarizer. The quarter wave retarder ($\lambda/4$) may be a stretched polymer film as is conventional in the art, or the quarter wave retarder ($\lambda/4$) may be a reactive mesogen layer that has been polymerized. When a reactive mesogen layer is used, then the reactive mesogen may be deposited on an alignment layer which is used to orientate the optical axis of the reactive mesogen layer in the desired direction (i.e. ±45°).

FIGS. 9A-9D are drawings depicting exemplary configurations of the switchable scattering device 68 for use in the display system of FIGS. 8A-8D, denoted as switchable scattering devices 68a-68d respectively. FIG. 9A shows a basic configuration of a switchable scattering device 68a, in which an electro-optic layer 74 is disposed between a viewing side substrate 76 and a non-viewing side substrate 78. The electro-optic layer 74 may be a liquid crystal layer. When the electro-optic 74 layer is a liquid crystal layer, then alignment layers may be used to form a 90° twisted nematic (TN) layer, a vertically aligned (VA) layer, or any other conventional liquid crystal mode capable of modulating light in combination with a polarizer. Electrodes 79 and 80 may be deposited adjacent to the electro-optic layer 74 to switch the electro-optic layer, as shown in FIG. 9B. The electrodes may be patterned. First and second polarizers 82 and 84 may be incorporated into the switchable scattering device as shown in FIGS. 9C and 9D, which show alternative positionings of the polarizers relative to the other layers. An advantage using one or more in-cell polarizer as the polarizers 82 and 84 (i.e., in-cell meaning a polarizer is positioned between substrates 76 and 78 of the switchable scattering device) over conventional polarizers is that the in-cell polarizers are much thinner (~50-250 μm thinner) than the conventional polarizers. In general, a layer (such as for example a polarizer, retarder) that is located between two substrates is considered to be in-cell. In the embodiment of FIG. 9C, only the viewing side polarizer 82 is an in-cell polarizer, whereas in the embodiment of FIG. 9D both the viewing side and non-viewing side polarizers 82 and 84 are in-cell polarizers. Reduced thickness may be significant for optimizing d2 to optimize the viewing angles in the narrow view mode. When an in-cell polarizer 84 of FIG. 9D is a linear polarizer, then the non-viewing side substrate 78 may be composed of a material that has an optical axis orientated at ±45° relative to the transmission axis of the in-cell polarizer such that substrate 78 performs a quarter wave plate function. The combination of substrate 78 that performs a quarter wave plate function and the associated in-cell linear polarizer 84 form a circular polarizer for light incident from the viewing direction.

Figure 10A:
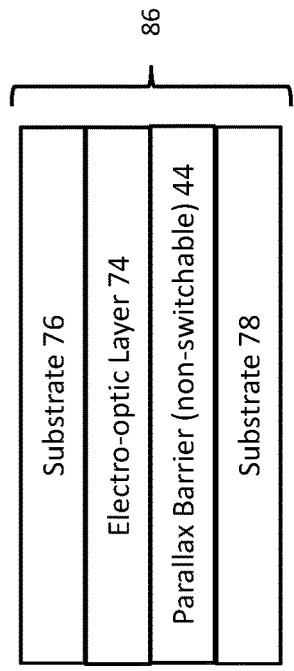
FIGS. 10A and 10B are drawings depicting a variation of previous embodiments that combines in a more integral structure a non-switchable parallax optic and switchable scattering device located on the viewing side of the top emitting electroluminescent display.
Figure 10B:
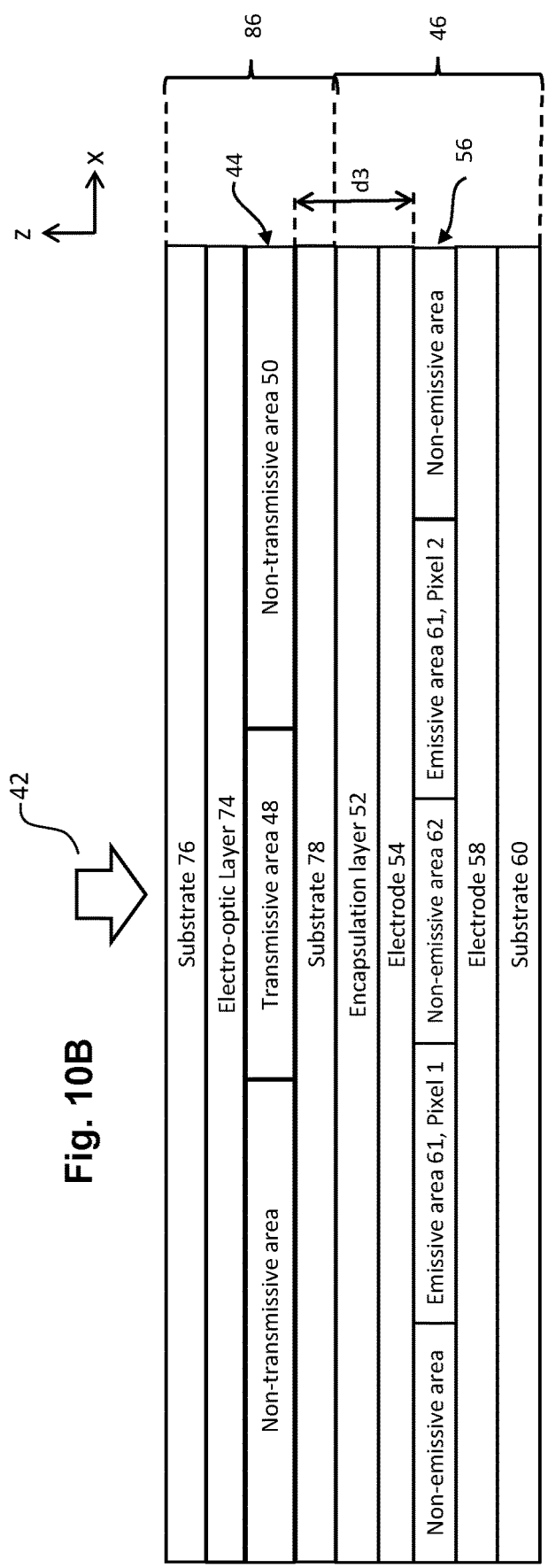

FIGS. 10A and 10B are drawings depicting a variation of the embodiment of FIGS. 7-9, in which the non-switchable parallax optic 44 is incorporated between the substrates 76 and 78 on the viewing side of the substrate 78 and on the non-viewing side of the electro-optic layer 74 of the switchable scattering device 68. This essentially forms a combined structure 86 that combines functionality of the separate non-switchable parallax optic and the switchable scattering device into a more integral structure between the two substrates 76 and 78. FIG. 10B illustrates such features in more detail and in combination with the top emitting electroluminescent display 46 and the associated components of the display 46. This embodiment may permit a more cost-effective fabrication method than depositing the non-switchable parallax barrier directly on top of the encapsulation layer as shown in FIGS. 7 and 8. Alternatively, the non-switchable parallax barrier may be deposited on the non-viewing side of substrate 78 prior to deposition of the entire structure 86 onto the top emitting electroluminescent display 46. Such embodiment also may permit a more cost-effective fabrication method than depositing the non-switchable parallax barrier directly on top of the encapsulation layer. The combined non-switchable parallax barrier/switchable scattering device 86 may be adhered in optical contact with the top emitting electroluminescent display with an adhesive (not shown). The distance between the emissive pixel layer of the top emitting electroluminescent display and the parallax barrier within the switchable scattering device is denoted again by d3 in FIG. 10B. In general, the distance between the emissive pixel layer of the top emitting electroluminescent display and the parallax optic is denoted by d3 in all figures.

A general approach of achieving a display that can be switched between a wide view mode and a narrow view mode is described above with respect to FIGS. 7-10, based on combining a top emitting electroluminescent display with an optical assembly 34 that constitutes a combination of both a non-switchable parallax optic and a switchable scattering device. An alternative general approach, as described in connection with subsequent figures, employs combining a top emitting electroluminescent display with an optical assembly 34 configured as an integrated component constituting a switchable parallax optic, whereby the switchable parallax optic is switchable between a parallax barrier state having transmissive and non-transmissive areas interlaced, and a wide viewing state that does not impose any directional restriction on the image light.

Accordingly, FIGS. 11A and 11B are drawings depicting a display system 90 that incorporates a switchable parallax optic 92 that is disposed on the viewing side of the top emitting electroluminescent display 46. The display 46 may be configured comparably as in previous embodiments, with the switchable parallax optic 92 constituting the optical assembly 34 as introduced in connection with FIGS. 5A-5C. Thus, the top emitting electroluminescent display 46 may include an encapsulation layer 52, a viewing side electrode 54, an electroluminescent layer 56, a non-viewing side electrode 58, and a substrate 60. The electroluminescent layer 56 may include an array of pixels having emissive areas 61 interlaced with non-emissive areas 62. The switchable parallax optic 92 may be adhered in optical contact with the top emitting electroluminescent display 46 with an adhesive (not shown). As shown in the more detailed depiction in FIG. 11B, the switchable parallax optic may include an electro-optic layer 94 that is disposed between a viewing side substrate 96 and a non-viewing side substrate 98.

A distance between the emissive pixel layer of the top emitting electroluminescent display 46 and the electro-optic layer 94 within the switchable parallax optic 92 is denoted as d3 because the electro-optic layer forms a parallax optic, such as a parallax barrier, for the narrow view mode. As detailed above, reduced thickness of d3 is significant for optimizing the viewing angles in the narrow view mode. The switchable parallax optic 92 is switchable between a first state that does not directionally restrict image light from the top emitting electroluminescent display (wide view mode), and a second state that does directionally restrict image light from the top emitting electroluminescent display (narrow view mode). In the narrow view mode, which is depicted in FIG. 11B, the switchable parallax optic may be switched to form a parallax barrier that includes interlaced transmissive areas 100 and non-transmissive areas 102, similarly as the non-switchable parallax barrier configuration of previous embodiments. Alternatively, in the narrow view mode (imaging mode), the switchable parallax optic may be switched to form an array of imaging lenses that can direct light of different images to different viewing directions. Alternatively, in the narrow view mode, the switchable parallax optic may be switched to form an array of imaging lenses separated by non-transmissive regions to direct light of different images to different viewing directions. Alternatively, in the narrow view mode, the switchable parallax optic may be switched to form an array of diffractive structures to direct light of different images to different viewing directions. As referenced above, the electro-optic layer 94 further may be switched to a state that does not cause parallax, which enables the wide view mode by not directionally restricting the light emitted from the display 46.

FIGS. 12A and 12B are drawings depicting exemplary configurations of display systems including a switchable parallax optic in combination with one or more polarizers. The polarizers, which may be linear or circular polarizers, may be employed in combination with the switchable parallax optic 92 to enhance performance as warranted for a given application. In particular, in the embodiment of FIG. 12A, a viewing side polarizer 104 is deposited on the viewing side of the switchable parallax optic 92. The embodiment of FIG. 12B includes both the viewing side polarizer 104 and an additional non-viewing side polarizer 106, with the switchable parallax optic 92 deposited between the two polarizers. With reference to FIG. 12A, if the switchable parallax optic requires polarized light, the polarizer 104 may be used to ensure correct functioning of the switchable parallax optic 92. An advantage of using a circular polarizer is that a circular polarizer may also reduce ambient reflections from the switchable parallax optic and/or the top emitting electroluminescent display. Reducing ambient reflections is important to improve image quality (such as contrast ratio and color gamut) when ambient lighting (such as office lighting or sunshine) is high. With reference to FIG. 12B, if the switchable parallax optic requires polarized light, the use of dual polarizers 104 and 106 further may be used to ensure correct functioning of the switchable parallax optic. An advantage of using two circular polarizers is that they may also reduce ambient reflections from the switchable parallax optic and/or the top emitting electroluminescent display.

Figure 13A:
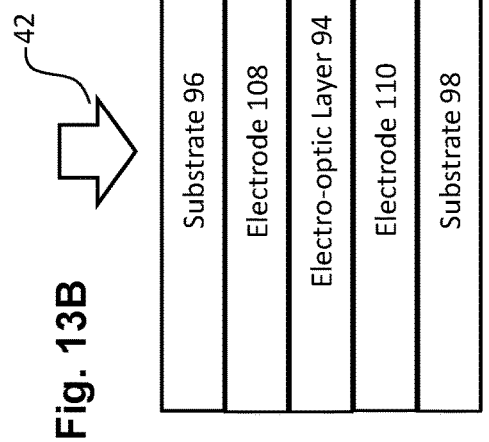
FIGS. 13A, 13B, 13C, and 13D are drawings depicting exemplary configurations of a switchable parallax optic for use in the display system of FIGS. 11A-12B.
Figure 13B:
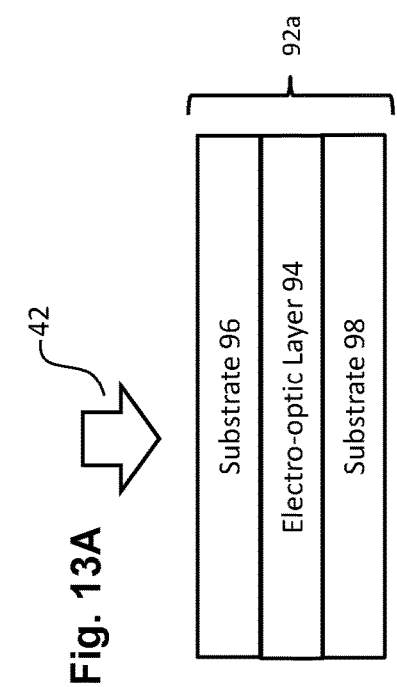
Figure 13C:
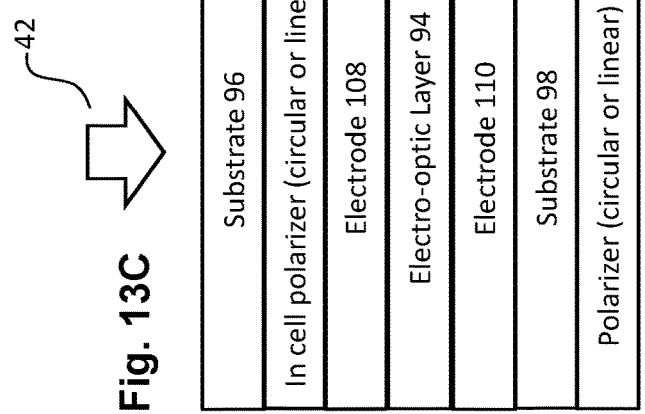
Figure 13D:
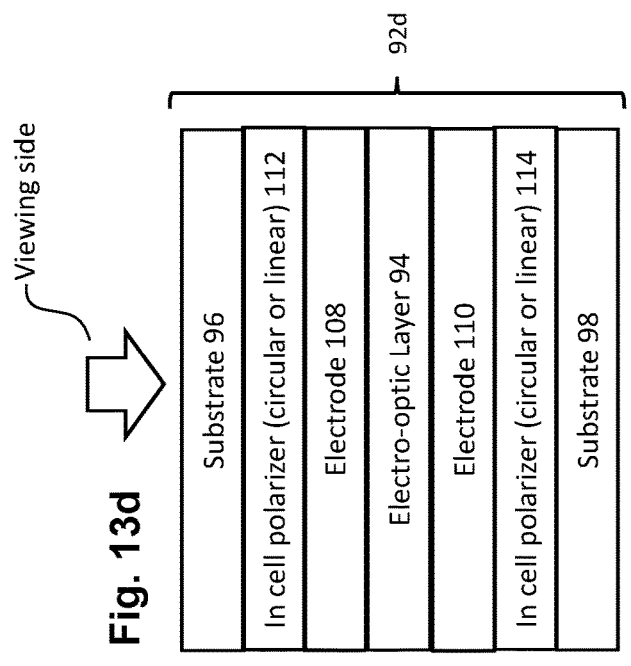

FIGS. 13A-13D are drawings depicting exemplary configurations of the switchable parallax optic 92 for use in the display system of FIGS. 11A-12B, denoted as switchable parallax optic devices 92a-92d respectively. FIG. 13A shows a basic configuration of a switchable parallax optic 92a, in which the electro-optic layer 94 is disposed between the non-viewing side substrate 98 and the viewing side substrate 96 comparably as depicted in FIG. 11B. Electrodes 108 and 110 may be disposed adjacent to the electro-optic layer 94 to switch the electro-optic layer, as shown in FIG. 13B. The electrodes may be patterned so that the electro-optic layer can be switched to form the transmissive and non-transmissive areas that form the parallax barrier. First and second polarizers 112 and 114 (linear or circular) may be incorporated into the switchable parallax optic 92 as shown in FIGS. 13C and 13D, which show alternative positionings of the polarizers relative to the other layers. With reference to FIG. 13C, an in-cell polarizer (circular or linear) 112 may be disposed between substrate 96 and the electro-optic layer 94, and a polarizer 114 (circular or linear) may be disposed on the non-viewing side of substrate 98. With reference to FIG. 13D, an in-cell polarizer (circular or linear) 112 again may be disposed between substrate 96 and the electro-optic layer 94, and polarizer 114 may be another in-cell polarizer (circular or linear) disposed between substrate 98 and the electro-optic layer 94. If the in-cell polarizer 114 shown in FIG. 13D is a linear polarizer, then substrate 98 may include a material that has an optical axis orientated at ±45° to the transmission axis of the in-cell polarizer such that substrate 98 performs a quarter wave plate function. The combination of substrate 98 that performs a quarter wave plate function and the associated in-cell linear polarizer 114 form a circular polarizer for light incident from the viewing direction. The advantage of the in-cell polarizers as shown in FIGS. 13C and 13D over conventional polarizers is that the in-cell polarizers are substantially thinner (~50-250 μm thinner) than the conventional polarizers. Reduced thickness may be significant for optimizing d3 to optimize the viewing angles in the narrow view mode.

Figure 14A:
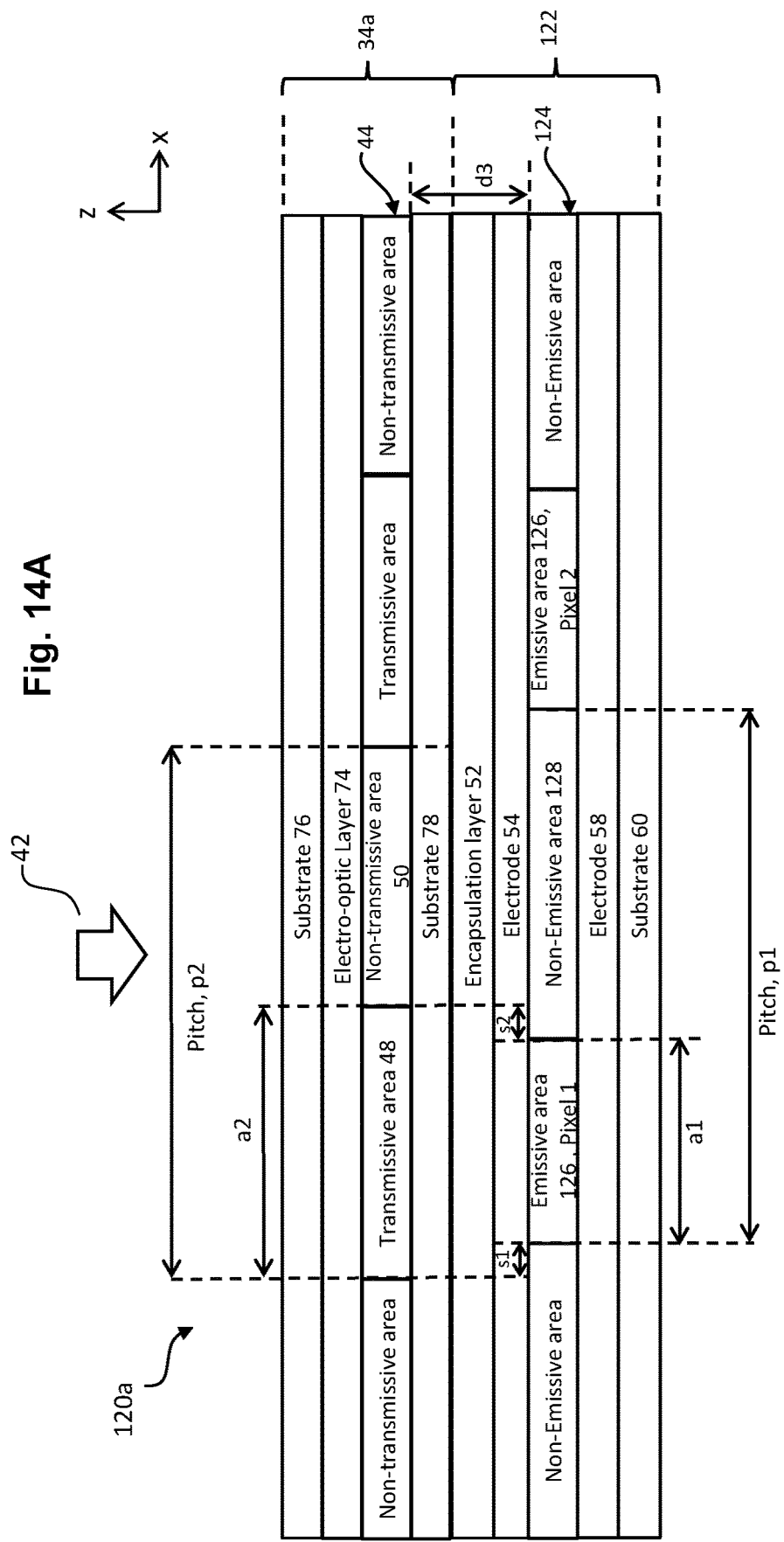
FIGS. 14A and 14B are drawings depicting a display system that includes a top emitting electroluminescent display having a variation in the pixel arrangement as compared with previous embodiments, in accordance with embodiments of the present application.
Figure 14B:
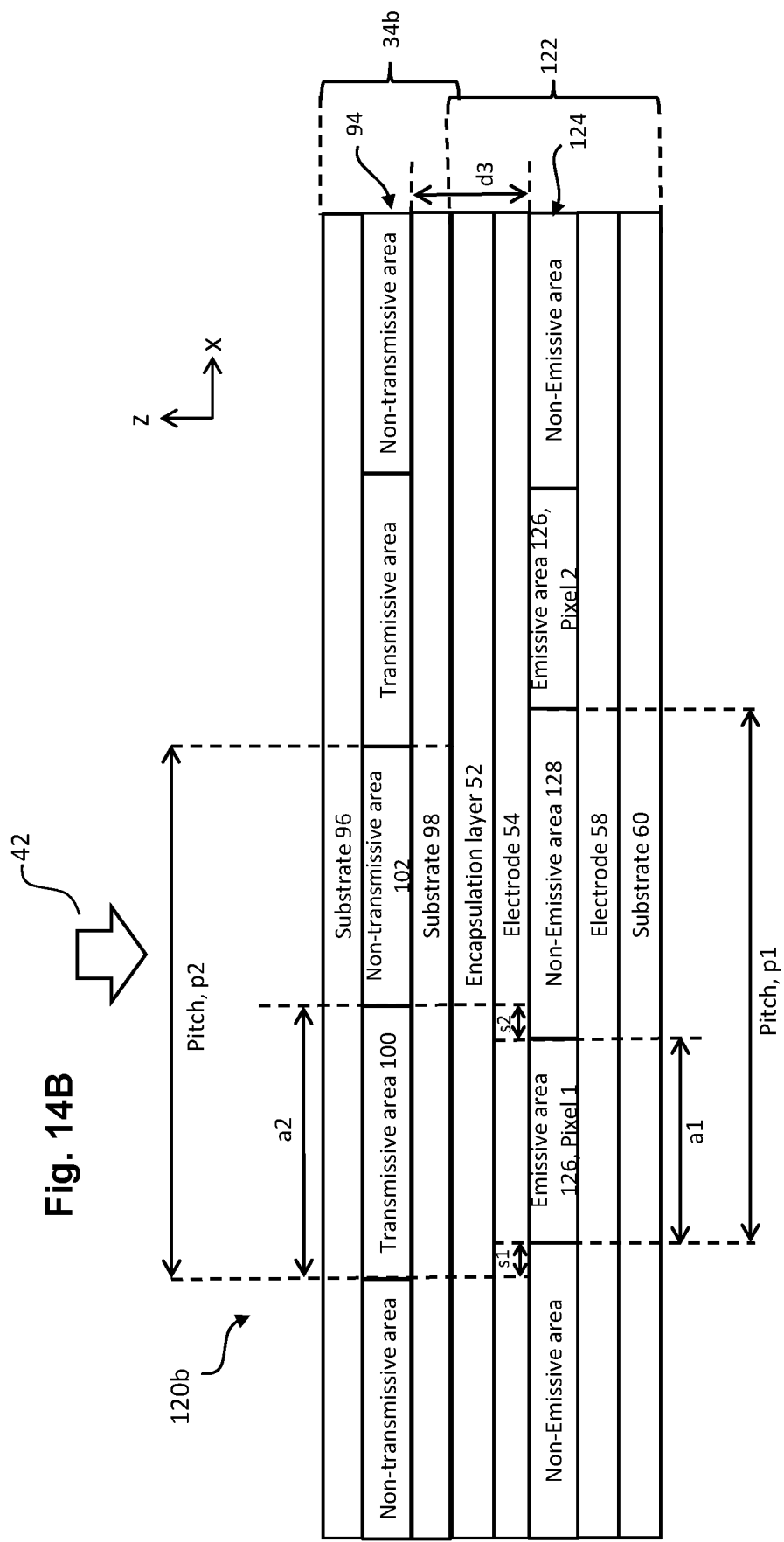

FIGS. 14A and 14B are drawings depicting a display system 120a/120b that includes a top emitting electroluminescent display having a variation in the pixel arrangement as compared with previous embodiments. FIG. 14A employs an optical assembly 34a that incorporates a non-switchable parallax barrier 44 in combination with a switchable scattering device including an electro-optic layer 74, comparably as shown in FIGS. 10A and 10B. FIG. 14B employs an optical assembly 34b that incorporates a switchable parallax optic 92 comparably as described in connection with FIGS. 11A and 11B. Comparable principles may apply to other embodiments. The optical arrangements 34a and 34b are disposed on a top emitting electroluminescent display 122 that has an electroluminescent layer 124. Similarly as in previous embodiments, the electroluminescent layer 124 may include an array of pixels having emissive areas 126 interlaced with non-emissive areas 128.

The narrow view mode of FIGS. 14A and 14B has a narrow angle viewing range for an image that may be addressed to all pixels in the electroluminescent layer 124. This configuration permits a single view privacy mode, in which a single image is emitted in a restricted viewing angle range (as compared to the dual view mode of previous embodiments). In the previous embodiments of FIGS. 7, 10B, and 11B, two emissive pixel areas are present for each transmissive area of the parallax barrier. In contrast, in the pixel arrangement of FIGS. 14A and 14B, one emissive pixel area 126 is present for each transmissive area 48/100 of the parallax barrier (either in the switchable or non-switchable embodiment). Accordingly, in the embodiment of FIGS. 14A and 14B, the pitch p2 of a parallax barrier element including one transmissive area and one non-transmissive area may be approximately the same as, and approximately in a range of 0.8 to 1.2 times, the size as pixel pitch p1 including one emissive area 126 and one non-emissive area 128. The top emitting electroluminescent display 122 and optical arrangements 34a and 34b of FIGS. 14A and 14B may be combined with embodiments described with respect to FIGS. 8-13 to enable a display system that can be switched between a narrow angle viewing mode and a wide angle viewing mode.

In FIGS. 14A and 14B, the resolution of the image in the narrow angle viewing range is 100% of the native resolution of the electroluminescent display. In other words, the narrow view mode is a single view mode whereby one independent image may be observed for a given range of restricted viewing angle. The resolution of the image in the wide angle viewing range also is 100% of the native resolution of the electroluminescent display, except that the image is emitted without viewing angle restriction.

A distance between the first (left) edge of the emissive area of Pixel 1 and the first (left) edge of the nearest parallax barrier transmissive area is s1. The distance between the second (right) edge of the emissive area of Pixel 1 and the second (right) edge of the nearest parallax barrier transmissive area is s2. If s1=s2, then the narrow view mode will be substantially symmetrical about the on-axis position. If s1≠s2, then the narrow view mode will be asymmetrical about the on-axis position. Similarly as with the previous embodiments, the emissive area width a1 may vary between red, green, and blue pixels. If a1 has different values for red, green, and/or blue pixels, then the value of width a2 of the transmissive barrier areas also may vary for red, green, and/or blue pixels accordingly. An advantage of a large width for a2 is that such width enables a brighter image. An advantage of a small width for a2 is that such width enables better angular control of the viewing windows (i.e. better control over the angular direction in which an image is observable). Consequently, the width of a2 may be optimized to enable an acceptable trade-off between brightness and viewing angle range.

Figure 15B:
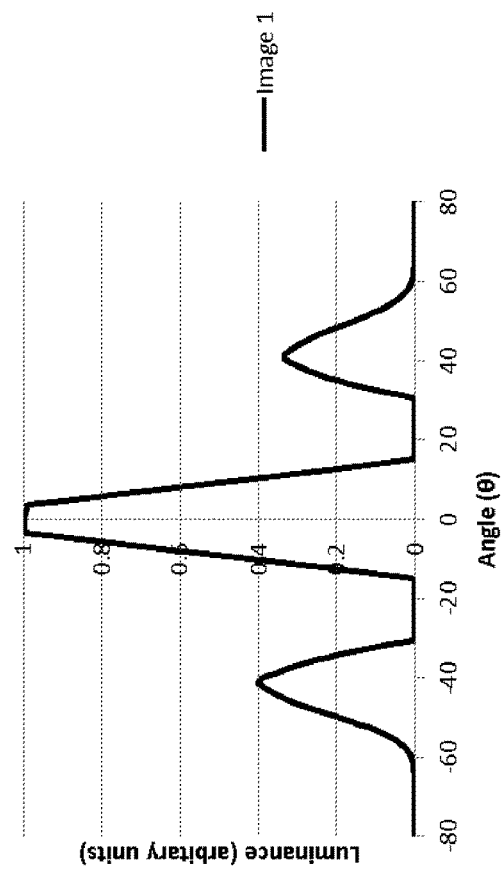
FIGS. 15A and 15B are optical simulations using a device configuration having an optical assembly configured comparably as in FIGS. 14A and 14B, with FIG. 15A relating to a top emitting device and FIG. 15B relating to a bottom emitting device.
Figure 15A:
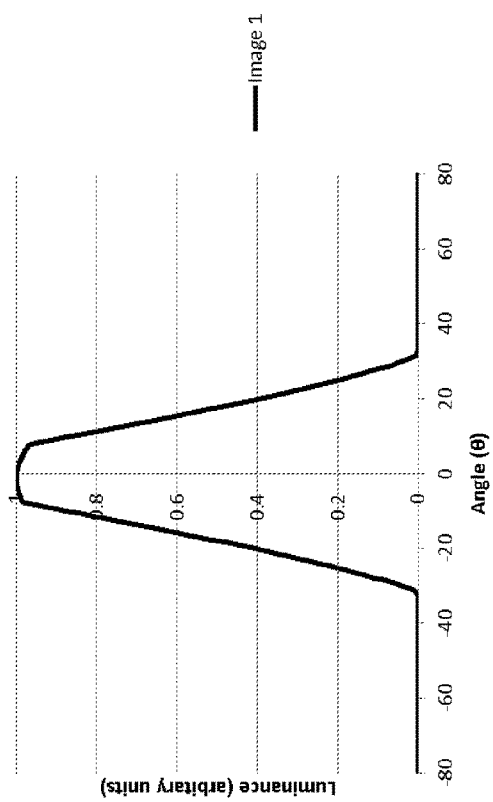

FIGS. 15A and 15B are graphs depicting optical simulations using a device configuration having an optical assembly configured comparably as in FIGS. 14A and 14B, with FIG. 15A relating to a top-emitting device and FIG. 15B relating to a bottom-emitting device. The narrow viewing mode shown in FIG. 15A is generated using the following parameters that are denoted as fractions of the pixel pitch p1. Such parameters include: pixel pitch=p1 μm; parallax barrier pitch, p2=p1 μm; d3=0.9*p1 μm; optical path length of d3=d3*1.52 μm; a1=0.4*p1 μm; a2=0.25*p1 μm; and s1=s2. The narrow viewing mode shown in FIG. 15A is desirable because the image cannot be viewed at large angles of incidence (i.e. the image is not visible for viewing angles greater than approximately 30°). The narrow viewing mode shown in FIG. 15A can be obtained because the optical path length of d3 is sufficiently small. The optical path length of d3 in FIG. 15A may be achieved using a top emitting electroluminescent display in combination with switchable optical assemblies described herein that can enable switching between a wide view mode and a narrow view mode.

The effectiveness of a top-emitting configuration as illustrated in FIG. 15A further is illustrated by comparison to a comparable bottom emitting configuration shown in FIG. 15B. The narrow viewing mode shown in FIG. 15B is generated using the following parameters, which again are denoted as fractions of the pixel pitch p1. Such parameters include: pixel pitch=p1 μm; parallax barrier pitch; p2=p1 μm; d3=1.9*p1 μm; optical path length of d3=d3*1.52 μm; a1=0.4*p1 μm; a2=0.25*p1 μm; and s1=s2. The narrow viewing mode shown in FIG. 15B is undesirable because the image can be viewed at large angles of incidence in the range of approximately 30°-60°. The narrow viewing mode shown in FIG. 15B results because the optical path length of d3 is too large. The optical path length of d3 in FIG. 15B may be achieved using a bottom emitting electroluminescent display in combination with switchable optical assemblies described herein that can enable switching between a wide view mode and a narrow view mode. Accordingly, a comparison of FIGS. 15A and 15B illustrate the superior performance of a top-emitting device over a bottom emitting device when using an optical assembly in accordance with embodiments of the present application.

In general, various parameter ranges may be employed within which acceptable angular dependent viewing windows for a single view mode (as shown in FIG. 15A) can be achieved for a top-emitting electroluminescent display. In general, $0.2<(d3/p1)<2.0$, and preferably $0.4<(d3/p1)<1.4$, where d3 is the distance between the emissive pixel layer and the parallax barrier layer and p1 is the pixel pitch. In general, $0.1<(a2/p1)<0.8$, and preferably $0.2<(a2/p1)<0.6$, where a2 is the width of the parallax barrier aperture. In general, $0.1<(a1+a2)/p1)<1.3$, and preferably $0.3<(a1+a2)/P1)<0.8$, where a1 is the width of the emissive pixel aperture. In general, $0.05<a1/p1<0.95$, and preferably $0.1<a1/p1<0.5$. The ranges disclosed above may be used singularly or in any combination to realize acceptable angular dependent viewing windows for a single view mode. These ranges are based upon an image panel design wherein the same color sub-pixels are arranged in the x-direction (horizontal direction with respect to the display) and different colored sub-pixels, such as red, green, and blue, are cyclically arranged in the y-direction (vertical direction with respect to the display). However, these ranges may also be applied to alternative pixel arrangements, such as a pentile arrangement or other suitable display configurations with more than three different colored pixel types.

Figure 16:
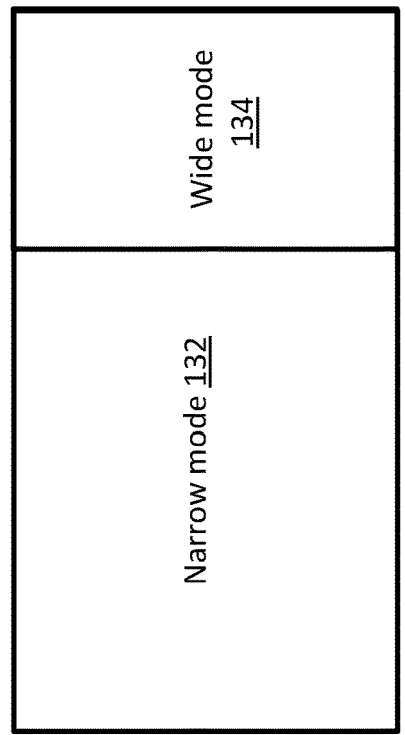
FIG. 16 is a drawing depicting an exemplary display system that has different viewing angle modes in two different spatial regions of the display system, in accordance with embodiments of the present application.

FIG. 16 is a drawing depicting an exemplary display system 130 that has different viewing angle modes in two different spatial regions of the display system. The viewing modes may be achieved using embodiments previously described. In general, the display system 130 includes at least a first spatial region 132 that is operable in a first viewing mode and a second spatial region 134 that is operable in a second viewing mode different from the first viewing mode. In the specific example of FIG. 16, the first spatial region 132 of the display system 130 is configured to show a narrow mode as the first viewing mode, and the second spatial region 134 of the display system 130 is configured to show a wide viewing mode as the second viewing mode that is different from the first viewing mode. Other configurations of different spatial regions being configured to operate in different display modes may be employed.

The narrow viewing mode may be a dual view mode in which different images are emitted toward different viewing angles, or a single view mode in which a single image is emitted within a narrow viewing angle. If narrow viewing modes are located in more than one spatial region of the display, the narrow viewing modes each may be operable in a dual view mode and/or a single view mode. To configure at least two different viewing modes in different spatial regions of the display system, the switchable optical arrangement deposited on the viewing side of the top emitting electroluminescent display (such as the switchable scattering device or the switchable parallax optic as described previously) may have patterned electrodes that can be driven independently. In addition, the image control electronics for the top emitting electroluminescent display addresses the correct image data to the correct pixels such that the correct image is steered into the desired viewing angle range by the optical assembly.

FIG. 17 is a drawing depicting a block diagram showing operative portions of an exemplary display system 140 including an optical assembly 34 according to any of the embodiments, and further demonstrating image display control. An electronic controller 142 uses image data which may be stored in an image data memory 144 to address the pixels of the top emitting electroluminescent display 146 using a conventional active matrix arrangement of column drivers 148 and row drivers 150 that drive a pixel array 152 according to an input from a viewing mode selector 154. The image data memory 144 may be embodied as any suitable non-transitory computer readable medium as are known in the art, and the electronic controller 142 and viewing mode selector 152 may be embodied as any suitable electronic control device, such as a microcomputer, microprocessor, CPU, or the like.

The controller 142 also addresses the electrodes of the optical arrangement 34 according to any of the embodiments via a conventional active matrix, a conventional passive matrix, or a conventional direct drive scheme according to an input from the viewing mode selector 154. The viewing mode selector 154 may be activated via an automatic input (such as image content) or a manually controlled input (such as a button or touchscreen). The viewing mode selector 154 provides information to the controller 142 to select the desired viewing mode (wide or narrow), which may be employed within a particular spatial region or regions of the display system as described above with respect to FIG. 16. The controller 142 simultaneously addresses the correct image data to the correct pixels of the top emitting electroluminescent display 146, and addresses the electrodes of the optical assembly 34 so that the correct viewing mode (wide or narrow) is active in the correct spatial location of the display.

The following figures illustrate certain variations and parameters that may be employed in accordance with embodiments of the present application.

Figure 18B:
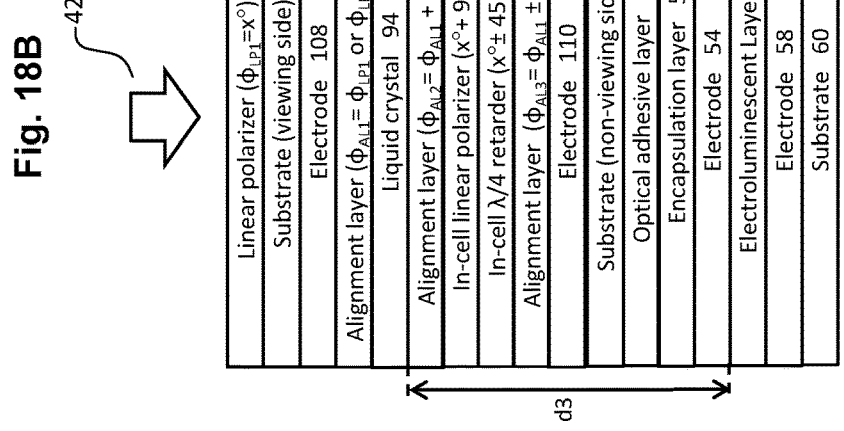
FIG. 18B is a drawing depicting a display system that is a variation on the embodiment of FIG. 18A.
Figure 18A:
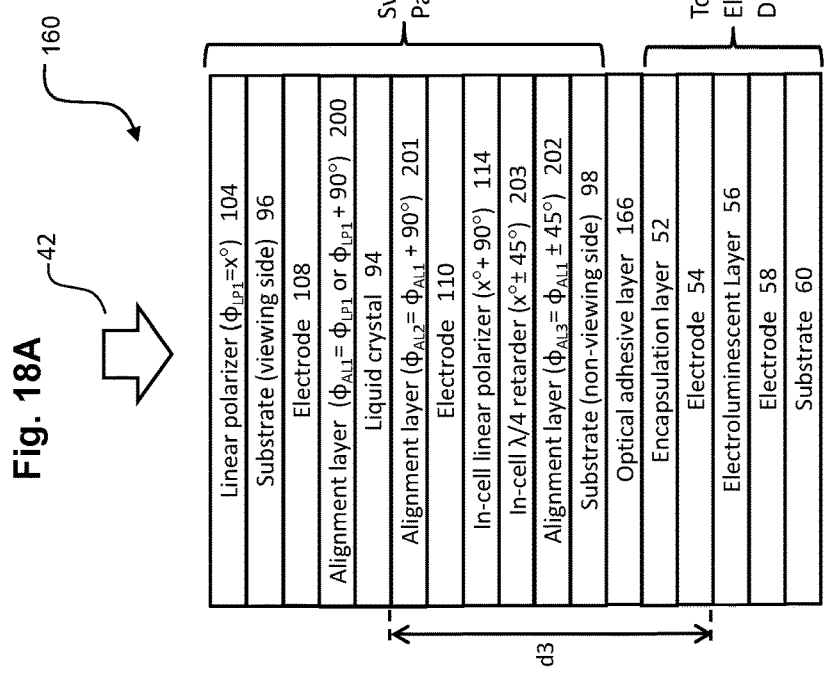
FIG. 18A is a drawing depicting an exemplary embodiment of a display system in accordance with embodiments of the present application, including a switchable parallax optic adhered to the viewing side of a top emitting electroluminescent display with an optically clear adhesive layer.

FIG. 18A is a drawing depicting an exemplary embodiment of a display system 160 including a switchable parallax optic 162 adhered to the viewing side 42 of a top emitting electroluminescent display 164 with an optically clear adhesive layer 166. The display device of FIG. 18A has a wide view mode and a narrow view mode. The wide view mode enables 100% resolution of the image. The narrow view mode may enable a dual view mode or a single view mode as previously described. From the viewing side, the switchable parallax optic 162 shown in FIG. 18A includes a linear polarizer 104 (first polarizer) with transmission axis orientated at $\varphi_{LP1}$=x°; a substrate 96 (viewing side switchable parallax optic substrate); an electrode layer 108 (which may be patterned in a manner previously described to enable the wide mode and narrow mode and also enable the wide mode and narrow mode to be simultaneously activated in different spatial area of the display); a first LC alignment layer 200 configured to align liquid crystal molecules in the plane of the substrate (horizontal alignment) and in a direction dictated by $\varphi_{AL1}=\varphi_{LP1}$ or $\varphi_{LP1}+90°$; a liquid crystal layer 94; a second LC alignment layer 201 configured to align liquid crystal molecules in the plane of the substrate (horizontal alignment) and in a direction dictated by $\varphi_{AL2}=\varphi_{AL1}+90°$; an electrode 110 (which may be patterned in a manner previously described to enable the wide mode and narrow mode and also enable the wide mode and narrow mode to be simultaneously activated in different spatial areas of the display); an in-cell linear polarizer 114 (second polarizer) with transmission axis orientated at $\phi_{LP1}+90°$; an in-cell quarter wave retarder ($\lambda$/4) 203 with optical axis orientated at $\phi_{LP1}\pm45°$; a third alignment layer 202 configured to align the in-cell quarter wave retarder 203 in the plane of the substrate (horizontal alignment) and in a direction dictated by $\varphi_{AL3}=\varphi_{AL1}\pm45°$; and a substrate 98 (non-viewing side switchable parallax optic substrate). An alignment layer (not shown) for the in-cell polarizer 114 may be deposited on the viewing side of the in-cell quarter wave retarder and used to align the in-cell polarizer 114 in the direction x°+90°. The in-cell linear polarizer 114 and in-cell quarter wave retarder 203 form a circular polarizer. The electrodes 108, 110 of the switchable parallax optic are patterned in a manner previously described so that a parallax barrier having transmissive and non-transmissive regions may be formed upon application of a suitable voltage across the liquid crystal layer 94. The electrodes 108, 110 of the switchable parallax optic may be patterned in a manner previously described to also enable the wide mode and narrow mode to be simultaneously activated in different spatial areas of the display 160. The liquid crystal layer 94 forms a 90° twisted nematic layer when no voltage is applied across the liquid crystal layer and thus transmits light emitted by the top emitting electroluminescent display 164. Application of a suitable voltage across the liquid crystal layer 94 causes absorption of the light emitted by the Top Emitting Electroluminescent Display 164, enabling the non-transmissive areas of the parallax barrier.

FIG. 18B is a drawing depicting a display system 160a that is a variation on the embodiment of FIG. 18A. In the embodiment of FIG. 18B, the position of the non-viewing side electrode 110 within the switchable parallax optic 162 has been changed. An advantage of the embodiment of FIG. 18A over that of FIG. 18B is a lower operating voltage for the switchable parallax optic because no voltage is dropped across the in-cell $\lambda$/4 retarder 203 and alignment layer 202, whereas an advantage of the embodiment of FIG. 18B over that of FIG. 18A is ease of manufacture.

Figure 19A:
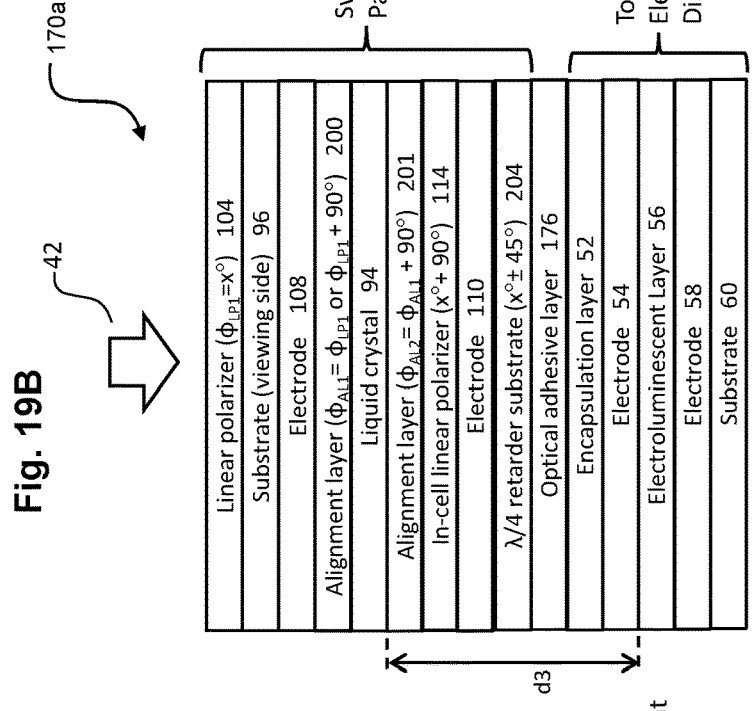
FIG. 19A is a drawing depicting another exemplary embodiment of a display system in accordance with embodiments of the present application, including a switchable parallax optic adhered to the viewing side of a top emitting electroluminescent display with an optically clear adhesive layer.

FIG. 19A is a drawing depicting an exemplary embodiment of a display system 170 including a switchable parallax optic 172 adhered to the viewing side 42 of a top emitting electroluminescent display 174 with an optically clear adhesive layer 176. The display device of FIG. 19A has a wide view mode and a narrow view mode. The wide view mode enables 100% resolution of the image. The narrow view mode may enable a dual view mode or a single view mode as previously described. The principle difference between display device 170 in FIG. 19A versus the display system 160 in FIG. 18A is that the quarter wave retarder ($\lambda$/4) 203 with optical axis orientated at $\phi_{LP1}\pm45°$ is not located in-cell in the embodiment of FIG. 19A. The non-viewing side switchable parallax optic substrate 204 including a polarizing material with an optical axis orientated at $\phi_{LP1}\pm45°$ so that the non-viewing side switchable parallax optic substrate 204 performs a quarter wave retarder ($\lambda$/4) function. An alignment layer (not shown) for the in-cell polarizer 114 may be deposited on the viewing side of the quarter wave retarder substrate 204 and used to align the in-cell polarizer 114 in the direction x°+90°. An advantage of the embodiment of FIG. 19A over that of FIG. 18A is lower manufacturing cost due to fewer materials and processing steps.

Figure 19B:
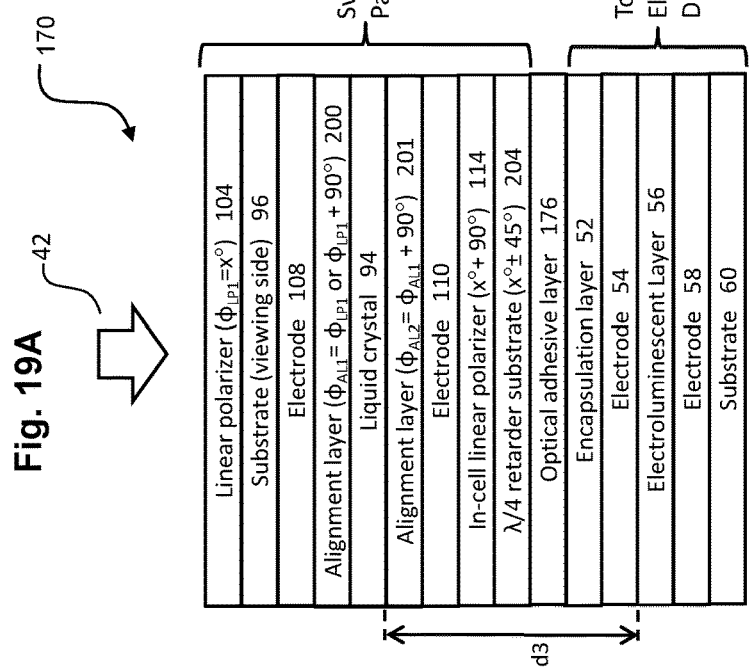
FIG. 19B is a drawing depicting a display system that is a variation on the embodiment of FIG. 19A.

FIG. 19B is a drawing depicting a display system 170a that is a variation on the embodiment of FIG. 19A. In the embodiment of FIG. 19B, the position of the non-viewing side electrode 110 has been changed. An alignment layer (not shown) for the in-cell polarizer 114 may be deposited on the viewing side of electrode 110. An advantage of the embodiment of FIG. 19A over that of FIG. 19B is a lower operating voltage for the switchable parallax optic because no voltage is dropped across the in-cell polarizer 114, whereas an advantage of the embodiment of FIG. 19B over that of FIG. 19A is ease of manufacture. An advantage of the embodiment of FIG. 19B over that of FIG. 18B is lower manufacturing cost due to fewer materials and processing steps.

Figure 20A:
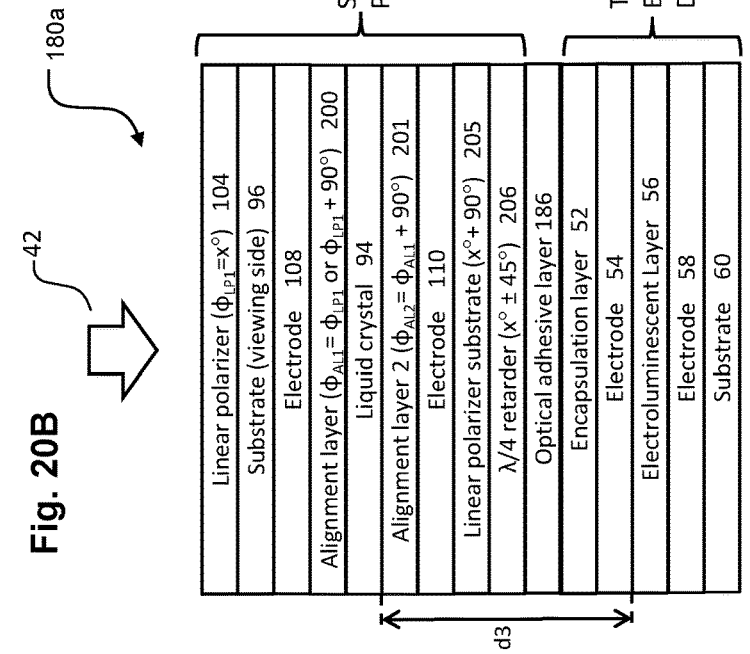
FIG. 20A is a drawing depicting another exemplary embodiment of a display system in accordance with embodiments of the present application, including a switchable parallax optic adhered to the viewing side of a top emitting electroluminescent display with an optically clear adhesive layer.

FIG. 20A is a drawing depicting an exemplary embodiment of a display system 180 including a switchable parallax optic 182 adhered to the viewing side 42 of a top emitting electroluminescent display 184 with an optically clear adhesive layer 186. The display system 180 has a wide view mode and a narrow view mode, and the wide view mode enables 100% resolution of the image. The narrow view mode may enable a dual view mode or a single view mode as previously described. From the viewing side, the switchable parallax optic 182 shown in FIG. 20A includes a linear polarizer 104 with transmission axis orientated at $\varphi_{LP1}$=x°; a substrate 96 (viewing side switchable parallax optic substrate); an electrode layer 108; an LC alignment layer 200 configured to align liquid crystal molecules in the plane of the substrate (horizontal alignment) and in a direction dictated by $\varphi_{AL1}=\varphi_{LP1}$ or $\varphi_{LP1}+90°$; a liquid crystal layer 94; an LC alignment layer 201 configured to align liquid crystal molecules in the plane of the substrate (horizontal alignment) and in a direction dictated by $\varphi_{AL2}=\varphi_{AL1}+90°$; an electrode 110 (which may be patterned in a manner previously described to enable the wide mode and narrow mode and also enable the wide mode and narrow mode to be simultaneously activated in different spatial area of the display); a linear polarizer 205 with transmission axis orientated at x°+90° wherein this linear polarizer also functions as a substrate upon which other layers may be deposited; an alignment layer 202 configured to align the quarter wave retarder 206 in the plane of the substrate (horizontal alignment) and in a direction dictated by $\varphi_{AL3}$=x°±45°; and a quarter wave retarder ($\lambda$/4) 206 with optical axis orientated at x°±45°. The linear polarizer substrate 205 and quarter wave retarder 206 form a circular polarizer. The electrodes 108, 110 of the switchable parallax optic are patterned in a manner previously described so that a parallax barrier having transmissive and non-transmissive regions may be formed upon application of a suitable voltage across the liquid crystal layer 94. The electrodes 108, 110 of the switchable parallax optic may be patterned in a manner previously described to also enable the wide mode and narrow mode to be simultaneously activated in different spatial areas of the display. The liquid crystal layer 94 forms a 90° twisted nematic layer when no voltage is applied across the liquid crystal layer 94 and thus transmits light emitted by the top emitting electroluminescent display 184. Application of a suitable voltage across the liquid crystal layer 94 causes absorption of the light emitted by the Top emitting electroluminescent display 184, enabling the non-transmissive areas of the parallax barrier. An advantage of this embodiment over previous embodiments is that the embodiment of FIG. 20A (and FIG. 20B described below) may provide stronger privacy because the linear polarizer substrate 205 may have a higher dichroic ratio than an in-cell polarizer 114.

Figure 20B:
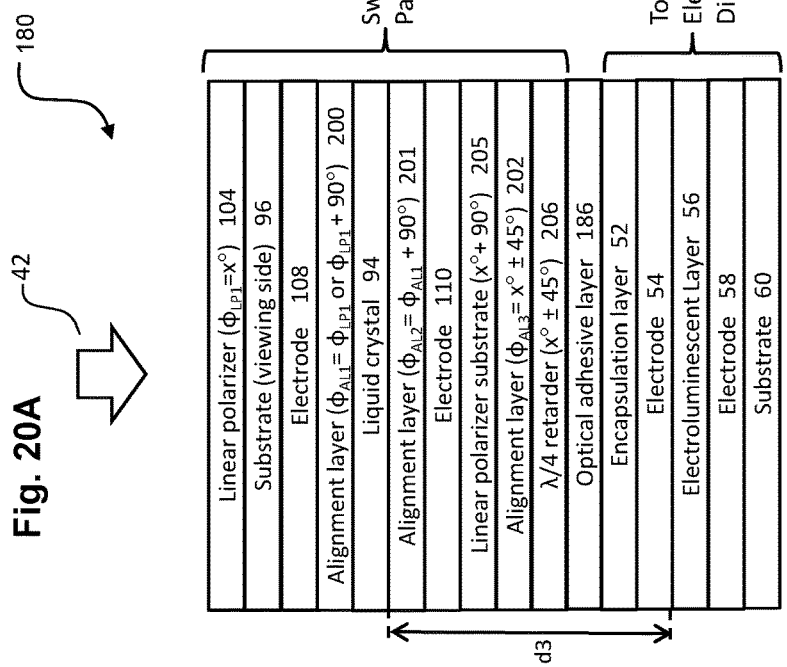
FIG. 20B is a drawing depicting a display system that is a variation on the embodiment of FIG. 20A.

FIG. 20B is a drawing depicting a display system 180a that is a variation on the embodiment of FIG. 20A. In the embodiment of FIG. 20B, the quarter wave retarder (λ/4) 206 no longer requires an alignment layer.

An aspect of the invention, therefore, is a multimode display device that is configured for enhanced performance of a non-directional (public) viewing mode and one or more directional (narrow) viewing modes. In exemplary embodiments, the display device includes a switchable optical assembly disposed on a viewing side of a top emitting electroluminescent display. The switchable optical assembly includes one of a switchable parallax layer that includes an electro optic material, or a non-switchable parallax layer in combination with a switchable scattering device that includes the electro-optic material and is disposed on the viewing side of the non-switchable parallax layer. The switchable optical assembly is switched so as to re-configure the display device between the non-directional and directional viewing modes. The display device may include one or more of the following features, either individually or in combination.

In an exemplary embodiment of the display device, the electro-optic material is a liquid crystal material.

In an exemplary embodiment of the display device, the switchable optical assembly includes patterned electrodes that are addressed to switch the switchable optical assembly.

In an exemplary embodiment of the display device, the switchable scattering device includes at least one polarizer disposed on a viewing side and/or disposed on a non-viewing side of the electro-optic material, wherein the at least one polarizer is a linear polarizer and/or a circular polarizer.

In an exemplary embodiment of the display device, the at least one polarizer is a linear polarizer that is an in-cell polarizer disposed between substrates of the switchable optical assembly.

In an exemplary embodiment of the display device, the display device further includes an in-cell quarter wave retarder disposed between substrates of the switchable optical assembly.

In an exemplary embodiment of the display device, the display device further includes a quarter wave retarder disposed on an outside face of a substrate of the switchable optical assembly.

In an exemplary embodiment of the display device, a substrate of the switchable optical assembly comprises a quarter wave plate retarder.

In an exemplary embodiment of the display device, a pitch of either the switchable parallax layer or the non-switchable parallax layer is approximately twice as large as a pixel pitch or sub-pixel pitch of the top emitting electroluminescent display.

In an exemplary embodiment of the display device, a pitch of either the switchable parallax layer or the non-switchable parallax layer has a pitch that is approximately the same as a pixel pitch or sub-pixel pitch of the top emitting electroluminescent display.

In an exemplary embodiment of the display device, transmissive and/or non-transmissive areas of the parallax optic are laterally aligned relative to pixel areas of the top emitting electroluminescent display in a predetermined manner.

In an exemplary embodiment of the display device, the lateral alignment varies as a function of lateral distance across the top emitting electroluminescent display.

In an exemplary embodiment of the display device, at least one of the following ranges is satisfied: $0.1<(d3/p1)<2.5$, $0.2<(a2/p1)<1.5$ and/or $0.3<(a1+a2)/p1)<1.9$; and wherein: d3 is a distance between an electroluminescent layer of the top emitting electroluminescent display and a surface of either the switchable parallax layer or the non-switchable parallax layer; p1 is a pixel pitch; a1 is a width of an emissive area of the electroluminescent layer; and a2 is a width of a transmissive area of either the non-switchable parallax layer or the switchable parallax layer when switched to a directional mode.

In an exemplary embodiment of the display device, at least one of the following ranges is satisfied: $0.2<(d3/p1)<2.0$, $0.1<(a2/p1)<0.8$, $0.1<(a1+a2)/p1)<1.3$ and/or $0.05<a1/p1<0.95$.; and wherein: d3 is a distance between an electroluminescent layer of the top emitting electroluminescent display and a surface of either the switchable parallax layer or the non-switchable parallax layer; p1 is a pixel pitch; a1 is a width of an emissive area of the electroluminescent layer; and a2 is a width of a transmissive area of either the non-switchable parallax layer or the switchable parallax layer when switched to a directional mode.

In an exemplary embodiment of the display device, the switchable optical assembly is switchable to switch the display device between a non-directional viewing mode and a directional viewing mode in which image light is emitted in accordance with viewing angle.

In an exemplary embodiment of the display device, the directional viewing mode includes a dual view mode in which a first image is emitted in a first viewing angle range and a second image is emitted in a second viewing angle range different from the first viewing angle range; and/or a single view mode in which a single image is emitted in a narrow viewing angle range as compared to the non-directional mode.

In an exemplary embodiment of the display device, the display device further includes a viewing mode selector for selecting a viewing mode of the display system, an image data memory that stores image data, and an electronic controller; wherein the electronic controller is configured to address the image data to pixels of the top emitting electroluminescent display, and is configured to address electrodes of the switchable optical assembly, such that the image data is displayed in accordance with the viewing mode selected by the viewing mode selector.

In an exemplary embodiment of the display device, the controller is configured to simultaneously address the image data to the pixels of the top emitting electroluminescent display and the electrodes of the switchable optical assembly, such that a wide angle viewing mode is activated in a first spatial region of the display device and a narrow angle viewing mode is activated in a second spatial region of the display device that is different to the first spatial region.

In an exemplary embodiment of the display device, the top emitting electroluminescent display is an organic light emitting diode display, a quantum dot display, a quantum rod display and/or an inorganic light emitting diode display.

In an exemplary embodiment of the display device, the display device includes a switchable parallax optic disposed on a viewing side of a top emitting electroluminescent display; wherein the switchable parallax optic comprises from the viewing side: a linear polarizer having a first alignment direction; a first alignment layer having a second alignment direction that is either parallel or perpendicular to the first direction; a switchable liquid crystal layer; a second alignment layer having a third alignment direction that is perpendicular to the second alignment direction; a linear polarizer having a fourth alignment direction that is perpendicular to the first alignment direction; and a quarter waveplate retarder aligned at 45° to the fourth alignment direction.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention relate to configurations and operation of many display devices in which multiple viewing modes dependent upon viewing angle are desirable. Examples of such devices include mobile phones including smartphones, personal digital assistants (PDAs), tablets, laptop computers, televisions, public information displays, automotive displays and the like.

REFERENCE SIGNS LIST

2—rod shaped object
3—alignment layer
4—viewing direction
6—generalized LCD device
10a—conventional bottom emitting electroluminescent display
10b—conventional bottom emitting electroluminescent display
10c—conventional top emitting electroluminescent display
10d—conventional top emitting electroluminescent display
12—viewing side
14—substrate
16—viewing side electrode
18—electroluminescent layer
20—non-viewing side electrode
22—encapsulation layer
30—display system
32—viewing side
34/34a/34b—switchable optical assembly
36—top emitting electroluminescent display
40/40a-d—top emitting electroluminescent display system
42—viewing side direction
44—parallax barrier
46—top emitting electroluminescent display
48—non-transmissive areas
50—transmissive areas
52—encapsulation layer
54—viewing side electrode
56—electroluminescent layer
58—non-viewing side electrode
60—substrate
61—emissive areas
62—non-emissive areas
68/68a-d—switchable scattering device
70—viewing side polarizer
72—non-viewing side polarizer
74—electro-optic layer
76—viewing side substrate
78—non-viewing side substrate
79—first electrode
80—second electrode
82—first polarizer
84—second polarizer
86—combined parallax optic and scattering device
90—display system
92/92a-d—switchable parallax optic
94—electro-optic layer
96—viewing side substrate
98—non-viewing side substrate
100—transmissive areas
102—non-transmissive areas
104—viewing side polarizer
106—non-viewing side polarizer
108—electrode
110—electrode
112—first polarizer
114—second polarizer
120a/120b—display system
122—top emitting electroluminescent display
124—electroluminescent layer
126—emissive areas
128—non-emissive areas
130—display system
132—first spatial region
134—second spatial region
140—display system
142—electronic controller
144—image data memory
146—top emitting electroluminescent display
148—column drivers
150—row drivers
152—pixel array
154—viewing mode selector
160/160a—display system
162—switchable parallax optic
164—top emitting electroluminescent display
166—adhesive layer
170/170a—display system
172—switchable parallax optic
174—top emitting electroluminescent display 176—adhesive layer
180/180a—display system
182—switchable parallax optic
184—top emitting electroluminescent display
186—adhesive layer
200 alignment layer
201 alignment layer
202 alignment layer
203 in-cell quarter wave retarder
204 quarter wave retarder substrate
205 linear polariser substrate
206 quarter wave retarder

What is claimed is:

1. A display device comprising:
   switchable optical assembly disposed on a viewing side of a top emitting electroluminescent display;
   wherein the switchable optical assembly comprises one of a switchable parallax layer that includes an electro optic material, or a non-switchable parallax layer in combination with a switchable scattering device that includes the electro-optic material and is disposed on the viewing side of the non-switchable parallax layer;
   wherein a pitch of either the switchable parallax layer or the non-switchable parallax layer has a pitch that is approximately the same as a pixel pitch of pixels or a sub-pixel pitch of sub-pixels of the top emitting electroluminescent display; and
   transmissive areas of the switchable parallax layer or the non-switchable parallax layer barrier are positioned relative to emissive areas of the pixels or sub-pixels to provide an on-axis viewing mode.

2. The display device of claim 1, wherein the electro-optic material is a liquid crystal material.

3. The display device of claim 1, wherein the switchable optical assembly includes patterned electrodes that are addressed to switch the switchable optical assembly.

4. The display device of claim 1, wherein the switchable scattering device includes at least one polarizer disposed on a viewing side and/or disposed on a non-viewing side of the electro-optic material, wherein the at least one polarizer is a linear polarizer and/or a circular polarizer.

5. The display device of claim 4, wherein the at least one polarizer is a linear polarizer that is an in-cell polarizer disposed between substrates of the switchable optical assembly.

6. The display device of claim 1, further comprising an in-cell quarter wave retarder disposed between substrates of the switchable optical assembly.

7. The display device of claim 1, further comprising a quarter wave retarder disposed on an outside face of a substrate of the switchable optical assembly.

8. The display device of claim 1, wherein a substrate of the switchable optical assembly comprises a quarter wave plate retarder.

9. The display system of claim 1, wherein transmissive and/or non-transmissive areas of the parallax optic are laterally aligned relative to pixel areas of the top emitting electroluminescent display in a predetermined manner.

10. The display system of any claim 9, wherein the lateral alignment varies as a function of lateral distance across the top emitting electroluminescent display.

11. The display device of claim 1, wherein the switchable optical assembly is switchable to switch the display device between a non-directional viewing mode and a directional viewing mode in which image light is emitted in accordance with viewing angle.

12. The display device of claim 11, wherein the directional viewing mode includes a dual view mode in which a first image is emitted in a first viewing angle range and a second image is emitted in a second viewing angle range different from the first viewing angle range; and/or a single view mode in which a single image is emitted in a narrow viewing angle range as compared to the non-directional mode.

13. The display system of claim 1, further comprising a viewing mode selector for selecting a viewing mode of the display system, an image data memory that stores image data, and an electronic controller;
   wherein the electronic controller is configured to address the image data to pixels of the top emitting electroluminescent display, and is configured to address electrodes of the switchable optical assembly, such that the image data is displayed in accordance with the viewing mode selected by the viewing mode selector.

14. The display system of claim 13, wherein the controller is configured to simultaneously address the image data to the pixels of the top emitting electroluminescent display and the electrodes of the switchable optical assembly, such that a wide angle viewing mode is activated in a first spatial region of the display device and a narrow angle viewing mode is activated in a second spatial region of the display device that is different to the first spatial region.

15. The display device of claim 1, wherein the top emitting electroluminescent display is an organic light emitting diode display, a quantum dot display, a quantum rod display and/or an inorganic light emitting diode display.

16. A display device comprising:
   switchable optical assembly disposed on a viewing side of a top emitting electroluminescent display;
   wherein the switchable optical assembly comprises one of a switchable parallax layer that includes an electro optic material, or a non-switchable parallax layer in combination with a switchable scattering device that includes the electro-optic material and is disposed on the viewing side of the non-switchable parallax layer;
   wherein the following ranges are satisfied: $0.1<(d3/p1)<2.5$, $0.2<(a2/p1)<1.5$ and $0.3<((a1+a2)/p1)<1.9$; and
   wherein:
   d3 is a distance between an electroluminescent layer of the top emitting electroluminescent display and a surface of either the switchable parallax layer or the non-switchable parallax layer;
   p1 is a pixel pitch;
   a1 is a width of an emissive area of the electroluminescent layer; and
   a2 is a width of a transmissive area of either the non-switchable parallax layer or the switchable parallax layer when switched to a directional mode.

17. The display device of claim 16, wherein at least one of the following ranges is satisfied: $0.2<(d3/p1)<2.0$, $0.1<(a2/p1)<0.8$, $0.1<((a1+a2)/p1)<1.3$ and/or $0.05<a1/p1<0.95$.

18. A display device comprising a switchable parallax optic disposed on a viewing side of a top emitting electroluminescent display;
   wherein the top emitting electroluminescent display includes a plurality of pixels or sub-pixels, and the switchable parallax optic comprises from the viewing side:
   a linear polarizer having a first alignment direction;
   a first alignment layer having a second alignment direction that is either parallel or perpendicular to the first direction;
   a switchable liquid crystal layer;

a second alignment layer having a third alignment direction that is perpendicular to the second alignment direction;
a linear polarizer having a fourth alignment direction that is perpendicular to the first alignment direction; and
a quarter waveplate retarder aligned at 45° to the fourth alignment direction; and
wherein transmissive areas of the switchable parallax optic are positioned relative to emissive areas of the pixels or sub-pixels to provide an on-axis viewing mode.

* * * * *